United States Patent
Ebiike et al.

(10) Patent No.: US 11,984,492 B2
(45) Date of Patent: May 14, 2024

(54) SILICON CARBIDE SEMICONDUCTOR DEVICE, POWER CONVERTER, AND METHOD OF MANUFACTURING SILICON CARBIDE SEMICONDUCTOR DEVICE

(71) Applicant: Mitsubishi Electric Corporation, Tokyo (JP)

(72) Inventors: Yuji Ebiike, Tokyo (JP); Yasuhiro Kagawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/660,947

(22) Filed: Apr. 27, 2022

(65) Prior Publication Data

US 2022/0254904 A1 Aug. 11, 2022

Related U.S. Application Data

(62) Division of application No. 16/371,948, filed on Apr. 1, 2019, now abandoned.

(30) Foreign Application Priority Data

May 9, 2018 (JP) ................................ 2018-090470

(51) Int. Cl.
*H01L 29/66* (2006.01)
*H01L 21/265* (2006.01)
(Continued)

(52) U.S. Cl.
CPC .... *H01L 29/66568* (2013.01); *H01L 21/2652* (2013.01); *H01L 21/31105* (2013.01);
(Continued)

(58) Field of Classification Search
CPC ........... H01L 29/1095; H01L 29/41766; H01L 29/7813; H01L 29/7397;
(Continued)

(56) References Cited

U.S. PATENT DOCUMENTS 5,471,075 A 11/1995 Shekar et al.
10,147,786 B2 12/2018 Hsieh et al.
(Continued)

FOREIGN PATENT DOCUMENTS

CN 107424928 A 12/2017
JP 2014038988 A * 2/2014 ........... H01L 29/063
(Continued)

OTHER PUBLICATIONS

An Office Action mailed by China National Intellectual Property Administration dated Nov. 2, 2022, which corresponds to Chinese Patent Application No. 201910363080.X and is related to U.S. Appl. No. 17/660,947; with English language translation.
(Continued)

*Primary Examiner* — Antonio B Crite
(74) *Attorney, Agent, or Firm* — Studebaker & Brackett PC

(57) ABSTRACT

A drift layer has a first conductivity type and is provided on a silicon carbide substrate. A well region has a second conductivity type and is provided on the drift layer. A source region has the first conductivity type and is provided on the well region. A gate trench has an inner surface with a bottom located at a deeper position than the well region and a lateral part continuous with the bottom. An electric field relaxation region has the second conductivity type and has at least a part located below the bottom of the gate trench. A surge relaxation region has the first conductivity type, contacts at least a part of the bottom of the gate trench, and is separated from the drift layer by the electric field relaxation region.

6 Claims, 15 Drawing Sheets

(51) Int. Cl.
| | |
|---|---|
| *H01L 21/311* | (2006.01) |
| *H01L 29/06* | (2006.01) |
| *H01L 29/08* | (2006.01) |
| *H01L 29/10* | (2006.01) |
| *H01L 29/16* | (2006.01) |
| *H01L 29/417* | (2006.01) |
| *H01L 29/423* | (2006.01) |
| *H01L 29/739* | (2006.01) |
| *H01L 29/78* | (2006.01) |
| *H01L 21/04* | (2006.01) |

(52) U.S. Cl.
CPC .... *H01L 29/1095* (2013.01); *H01L 29/66712* (2013.01); *H01L 29/7813* (2013.01)

(58) Field of Classification Search
CPC ... H01L 29/0642–0653; H01L 29/0684–0696; H01L 29/7811; H01L 29/7823; H01L 29/1083; H01L 29/7809; H01L 29/66727; H01L 29/66734; H01L 21/761
See application file for complete search history.

(56) References Cited

U.S. PATENT DOCUMENTS

| | | | |
|---|---|---|---|
| 10,236,339 B2 | 3/2019 | Kyogoku et al. | |
| 2013/0285140 A1* | 10/2013 | Kagawa | H01L 29/42376 438/270 |
| 2014/0197479 A1 | 7/2014 | Um et al. | |
| 2016/0005861 A1 | 1/2016 | Nishimura et al. | |
| 2017/0221714 A1 | 8/2017 | Wakimoto et al. | |
| 2017/0338302 A1* | 11/2017 | Hsieh | H01L 29/66348 |
| 2018/0033885 A1 | 2/2018 | Okumura et al. | |
| 2018/0076285 A1 | 3/2018 | Tanaka et al. | |
| 2018/0083094 A1 | 3/2018 | Kyogoku et al. | |
| 2018/0138300 A1 | 5/2018 | Baba et al. | |
| 2018/0197948 A1 | 7/2018 | Hsieh et al. | |
| 2018/0269064 A1 | 9/2018 | Wakimoto et al. | |
| 2019/0304787 A1 | 10/2019 | Wakimoto et al. | |

FOREIGN PATENT DOCUMENTS

| | | |
|---|---|---|
| JP | 2014-135494 A | 7/2014 |
| JP | 2017-139441 A | 8/2017 |
| WO | 2014/115280 A1 | 7/2014 |
| WO | 2016/157606 A1 | 10/2016 |
| WO | 2017/175460 A1 | 10/2017 |

OTHER PUBLICATIONS

An Office Action issued by the German Patent and Trademark Office dated May 11, 2022, which corresponds to German Patent Application No. 102019206090.0 and is related to U.S. Appl. No. 17/660,947; with English language translation.

Rina Tanaka et el., "Impact of Grounding the Bottom Oxide Protection Layer on the Short-Circuit Ruggedness of 4H-SiC Trench MOSFETs", Proceedings of the 26th International Symposium on Power Semiconductor Devices & IC's, Jun. 15-19, 2014, pp. 75 to 78, 2014 IEEE, Waikoloa, Hawaii.

An Office Action; "Notice of Reasons for Refusal," mailed by the Japanese Patent Office dated Nov. 16, 2021, which corresponds to Japanese Patent Application No. 2018-090470 and is related to U.S. Appl. No. 16/371,948 with English translation.

An Office Action; "Notice of Reasons for Refusal", mailed by the Japanese Patent Office dated Apr. 20, 2021, which corresponds to Japanese Patent Application No. 2018-090470 and is related to U.S. Appl. No. 16/371,948; with English language translation.

* cited by examiner

SILICON CARBIDE SEMICONDUCTOR DEVICE, POWER CONVERTER, AND METHOD OF MANUFACTURING SILICON CARBIDE SEMICONDUCTOR DEVICE

CROSS-REFERENCE TO RELATED APPLICATION

This application is a Divisional of U.S. patent application Ser. No. 16/371,948 filed Apr. 1, 2019, which claims priority to and the benefit of Japanese Patent Application No. 2018-090470 filed May 9, 2018, the entire contents of which are incorporated herein by reference.

FIELD OF THE INVENTION

The present relates to a silicon carbide semiconductor device, a power converter, and a method of manufacturing a silicon carbide semiconductor device.

BACKGROUND ART

For energy saving of power electronic equipment such as an inverter, loss reduction is required in a semiconductor switching element such as an insulated gate bipolar transistor (IGBT) or a metal oxide semiconductor field effect transistor (MOSFET). The loss is determined by conduction loss and switching loss in the element. To reduce these loses, development is proceeding in technology using a wide bandgap semiconductor material such as silicon carbide (SiC) or gallium nitride (GaN). To reduce loss in an MOSFET, a trench gate MOSFET including a trench for a gate structure, namely, including a gate trench is used.

As stated in International Patent Application Publication No. 2014/115280, for example, in a trench gate SiC-MOSFET having an n-type drift layer, a p-type electric field relaxation region is arranged below a trench gate. The breakdown voltage of SiC is higher than that of Si. Hence, in many cases of using SiC, design resulting in generation of a high electric field is employed by taking advantage of the characteristics of SiC. If a high voltage is applied to a drain while the SiC-MOSFET as a switching element is in an OFF state, electric field concentration on a gate insulating film at the bottom of the trench gate is reduced by the electric field relaxation region. This reduces the occurrence of breakdown of the gate insulating film to be caused by the electric field concentration. In this way, the gate insulating film is allowed to have increased reliability while in an OFF state.

The phenomenon of breakdown of the gate insulating film at the trench gate has been observed on the occurrence of a short in the trench gate SiC-MOSFET. This phenomenon is considered to be caused by instantaneous voltage drop accompanying generation of a surge current in the electric field relaxation region on the occurrence of the short. A high resistance value in a range from the electric field relaxation region to a source electrode is known to develop a tendency to cause breakdown more easily. This breakdown phenomenon occurs not only on the occurrence of a short but also on the occurrence of a state where steep voltage variations are caused by high-speed switching (a state where DV/Dt is high).

According to Proc. 26$^{th}$ ISPSD (2014), pp. 75-78 written by R. Tanaka et al., an electrical contact is provided at the bottom of a trench to electrically connect an electric field relaxation region to a source electrode. This makes it possible to reduce a resistance value in a range from the electric field relaxation region to the source electrode.

According to the technique stated in Proc. 26$^{th}$ ISPSD (2014), pp. 75-78, to reduce a resistance value sufficiently in the range from the electric field relaxation region to the source electrode, a large number of electrical contacts are required to be provided at the bottom of the trench. Providing a large number of such contact structures reduces the ratio of a region functional as a channel in an MOSFET. This unfortunately increases the ON resistance of the MOSFET. In particular, if the electric field relaxation region is a p-type region, a resistance value is likely to be increased in the range from the electric field relaxation region to the source electrode for reason that the electrical resistance of p-type SiC is generally high. In this case, the foregoing problem is likely to become more serious.

SUMMARY OF THE INVENTION

The present invention has been made to solve the foregoing problem. It is an object of the present invention to provide a silicon carbide semiconductor device capable of reducing the occurrence of insulation breakdown in a gate insulating film to be caused by application of a high electric field to a gate trench resulting from steep voltage variations in an electric field relaxation region.

A silicon carbide semiconductor device according to the present invention includes a silicon carbide substrate and a semiconductor layer provided on the silicon carbide substrate. The semiconductor layer includes a drift layer, a well region, a source region, a gate trench, an electric field relaxation region, and a surge relaxation region. The drift layer has a first conductivity type and is provided on the silicon carbide substrate. The well region has a second conductivity type different from the first conductivity type and is provided on the drift layer. The source region has the first conductivity type and is provided on the well region. The gate trench has an inner surface with a bottom located at a deeper position than the well region and a lateral part continuous with the bottom. The electric field relaxation region has the second conductivity type and has at least a part located below the bottom of the gate trench. The surge relaxation region has the first conductivity type, contacts at least a part of the bottom of the gate trench, and is separated from the drift layer by the electric field relaxation region.

A power converter according to the present invention includes a main converter circuit, a driver circuit, and a control circuit. The main converter circuit includes the silicon carbide semiconductor device described above, and converts input power to converted power and outputs the converted power. The driver circuit outputs a driving signal for driving the silicon carbide semiconductor device to the silicon carbide semiconductor device. The control circuit outputs a control signal for controlling the driver circuit to the driver circuit.

A method of manufacturing a silicon carbide semiconductor device according to one aspect of the present invention includes the following steps.

A silicon carbide substrate, and a semiconductor layer provided on the silicon carbide substrate and including a drift layer having a first conductivity type are prepared.

A preliminary trench is formed by etching the drift layer. An electric field relaxation region is formed by implanting impurities of a second conductivity type different from the first conductivity type into the bottom of the preliminary trench. A gate trench having a greater depth than the preliminary trench is formed by etching the bottom of the preliminary trench. A surge relaxation region is formed by implanting impurities of the first conductivity type into the bottom of the gate trench. The surge relaxation region contacts at least a part of the bottom of the gate trench and is separated from the drift layer by the electric field relaxation region.

A method of manufacturing a silicon carbide semiconductor device according to a different aspect of the present invention is a method of manufacturing a silicon carbide semiconductor device including a silicon carbide substrate and a semiconductor layer provided on the silicon carbide substrate. The semiconductor layer includes a drift layer, a well region, a source region, a gate trench, an electric field relaxation region, a surge relaxation region, a first connection region, and a second connection region. The drift layer has a first conductivity type and is provided on the silicon carbide substrate. The well region has a second conductivity type different from the first conductivity type and is provided on the drift layer. The source region has the first conductivity type and is provided on the well region. The gate trench has an inner surface with a bottom located at a deeper position than the well region and a lateral part continuous with the bottom. The electric field relaxation region has the second conductivity type and has at least a part located below the bottom of the gate trench. The surge relaxation region has the first conductivity type, contacts at least a part of the bottom of the gate trench, and is separated from the drift layer by the electric field relaxation region. The first connection region has the first conductivity type, extends along the inner surface of the gate trench, and connects the surge relaxation region to the source region. The second connection region has the second conductivity type and connects the electric field relaxation region to the well region. The first connection region is separated from the drift layer by the second connection region. This method of manufacturing the silicon carbide semiconductor device includes the following steps.

The gate trench is formed by etching the semiconductor layer. The first connection region is formed by adding impurities of the first conductivity type by oblique ion implantation into the lateral part of the gate trench. The second connection region is formed by adding impurities of the second conductivity type by rotating ion implantation into the lateral part of the gate trench.

In the silicon carbide semiconductor device according to the present invention, the surge relaxation region is provided to contact at least a part of the bottom of the gate trench. This prevents a high electric field resulting from steep voltage variations in the electric field relaxation region from being applied at least to this part of the gate trench. As a result, the occurrence of insulation breakdown is reduced in the gate insulating film.

In the power converter according to the present invention, the silicon carbide semiconductor device described above is used in the main converter circuit in the power converter. This reduces the occurrence of insulation breakdown in the gate insulating film provided in the silicon carbide semiconductor device. As a result, the main converter circuit provided in the power converter is given enhanced reliability.

In the method of manufacturing the silicon carbide semiconductor device according to the one aspect of the present invention, etching is performed further after the electric field relaxation region is formed by implanting impurities into the preliminary trench. Then, the surge relaxation region can be formed by impurity implantation. In this case, the silicon carbide semiconductor device of the present invention is obtained through the simple steps.

In the method of manufacturing the silicon carbide semiconductor device according to the different aspect of the present invention, the second connection region can be formed by adding the impurities of the second conductivity type by the rotating ion implantation into the lateral part of the gate trench. Thus, the resultant second connection region is formed around the gate trench entirely. This makes it possible to separate the first connection region more reliably from the drift layer by the second connection region.

These and other objects, features, aspects and advantages of the present invention will become more apparent from the following detailed description of the present invention when taken in conjunction with the accompanying drawings.

EMBODIMENT FOR CARRYING OUT THE INVENTION

Figure 1:
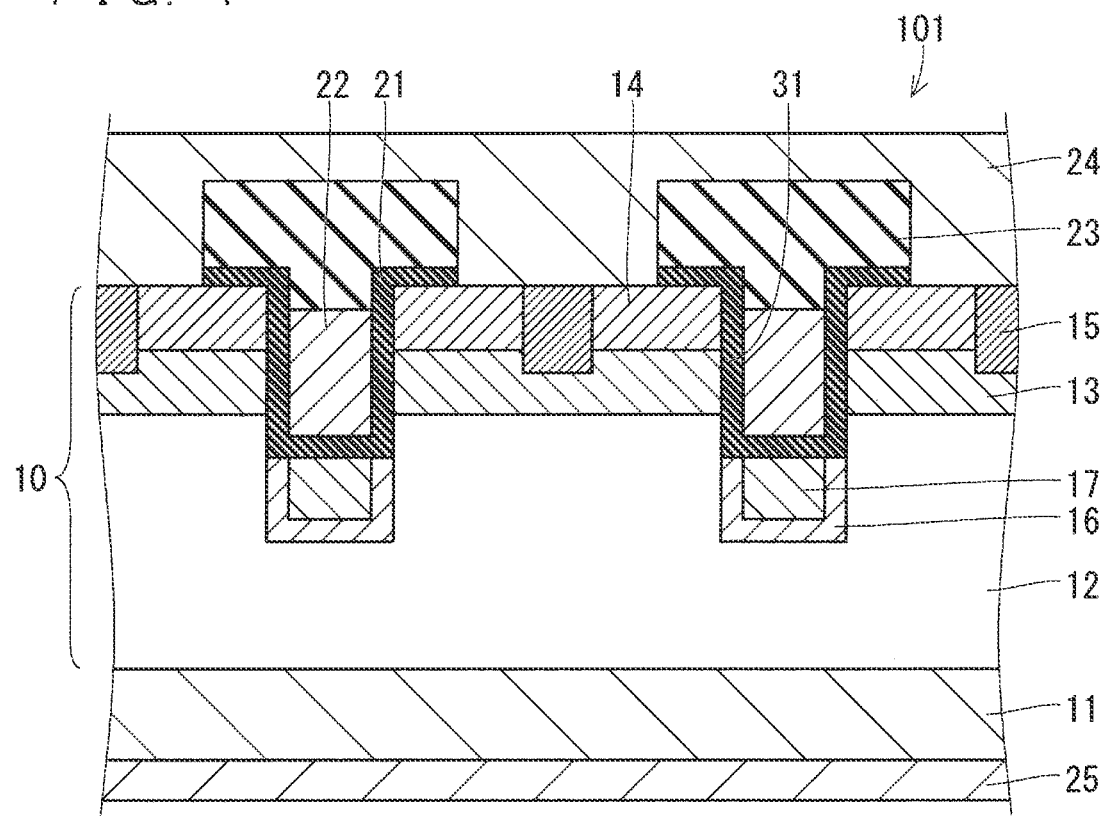
FIG. 1 is a partial sectional view schematically showing the configuration of a silicon carbide semiconductor device according to a first preferred embodiment of the present invention.

Preferred embodiments of the present invention will be described below based on the drawings. In the drawings referred to in the following description, corresponding or comparable parts are given the same reference sign and will not be described repeatedly.

First Preferred Embodiment (Configuration)

FIG. 1 is a partial sectional view schematically showing the configuration of an MOSFET 101 (silicon carbide semiconductor device) according to a first preferred embodiment. The MOSFET 101 includes an SiC substrate 11 (silicon carbide substrate), an epitaxial layer 10 (semiconductor layer) provided on one surface (in FIG. 1, upper surface) of the SiC substrate 11, a gate insulating film 21, a gate electrode 22, an interlayer insulating film 23, a source electrode 24, and a drain electrode 25. The epitaxial layer 10 includes a drift layer 12, a well region 13, a source region 14, a well contact region 15, an electric field relaxation region 16, and a surge relaxation region 17. The epitaxial layer 10 is preferably made of SiC.

In the first preferred embodiment, the SiC substrate 11 has the same conductivity type as the drift layer 12. The drift layer 12 has an n-type (first conductivity type) and is provided on the SiC substrate 11. The drift layer 12 is preferably made of SiC. The well region 13 has a p-type (second conductivity type different from the first conductivity type) and is provided on the drift layer 12. The well region 13 may be arranged at each of a plurality of sections over the drift layer 12. The source region 14 has the n-type and is provided on the well region 13. The well contact region 15 has the p-type and is provided on the well region 13. The well contact region 15 is continuous with the well region 13. The well contact region 15 is to stabilize switching characteristics by electrically connecting the well region 13 to the source electrode 24.

The epitaxial layer 10 is provided with a gate trench 31 having an inner surface. The inner surface of the gate trench 31 has a bottom located at a deeper position than the well region 13, and a lateral part continuous with the bottom. More specifically, the lateral part of the gate trench 31 penetrates the source region 14 and the well region 13 to reach the drift layer 12. The gate insulating film 21 is provided on the inner surface of the gate trench 31. The gate insulating film 21 is an oxide film, for example. The gate electrode 22 is provided in the gate trench 31 while the gate insulating film 21 is provided between the gate electrode 22 and the gate trench 31.

The electric field relaxation region 16 has the p-type. The electric field relaxation region 16 has at least a part located below the bottom of the gate trench 31. In the first preferred embodiment, the electric field relaxation region 16 contacts the gate trench 31, more specifically, contacts the bottom of the gate trench 31.

The surge relaxation region 17 has the n-type. The surge relaxation region 17 contacts at least a part of the bottom of the gate trench 31. The surge relaxation region 17 is separated from the drift layer 12 by the electric field relaxation region 16. In other words, the surge relaxation region 17 is arranged inside the electric field relaxation region 16.

The interlayer insulating film 23 provides insulation between the gate electrode 22 and the source electrode 24. The source electrode 24 is connected to the source region 14 and the well contact region 15. This connection is preferably ohmic connection. The drain electrode 25 is provided on the opposite surface (in FIG. 1, lower surface) of the SiC substrate 11. Thus, the MOSFET 101 is a vertical semiconductor device. In the first preferred embodiment, the drain electrode 25 preferably forms ohmic contact with the SiC substrate 11.

(Operation)

The operation of the MOSFET 101 will be described below.

When a positive voltage is applied to the gate electrode 22, a channel as a current path is formed in a part of the well region 13 contacting the gate insulating film 21. By applying a positive voltage to the drain electrode 25 in this state, a current is caused to flow from the drain electrode 25 into the source electrode 24 while passing through the SiC substrate 11, the drift layer 12, the part of the well region 13 as a channel, and the source region 14.

When the positive voltage applied to the gate electrode 22 is removed or a negative voltage is applied to the gate electrode 22 thereafter, the channel is removed. By doing so, even if a high voltage is applied to the drain electrode 25, a current does not flow between the drain and the source. In other words, the MOSFET 101 is brought to an OFF state. In the OFF state, the presence of the electric field relaxation region 16 relaxes electric field concentration on the gate insulating film 21 at the bottom of the gate trench 31.

If a large current is generated for reason such as a short or if high-speed switching is made in the MOSFET 101, a displacement current is caused to flow from the electric field relaxation region 16 toward the source electrode 24. At this time, an electric field is applied to the gate insulating film 21 at the bottom of the gate trench 31 as a result of voltage drop caused by the displacement current; intensity of the electric field is reduced by the surge relaxation region 17. In a configuration where a semiconductor material forming an MOSFET is SiC and an electric field relaxation region has the p-type like in the first preferred embodiment, the foregoing effect achieved by employing the surge relaxation region 17 is particularly notable for reason that the p-type SiC generally has high electrical resistance.

(Manufacturing Method)

A method of manufacturing the MOSFET 101 will be described next by referring to FIGS. 2 to 6. The following manufacturing method is an example and is changeable, particularly in terms of the order in which the manufacturing method is implemented, within a range that does not interfere. Only active regions in the MOSFET 101 will be described, and description of a terminal structure will be omitted. The terminal structure can be designed using a publicly-known technique appropriately so as to ensure an intended breakdown voltage.

Figure 2:
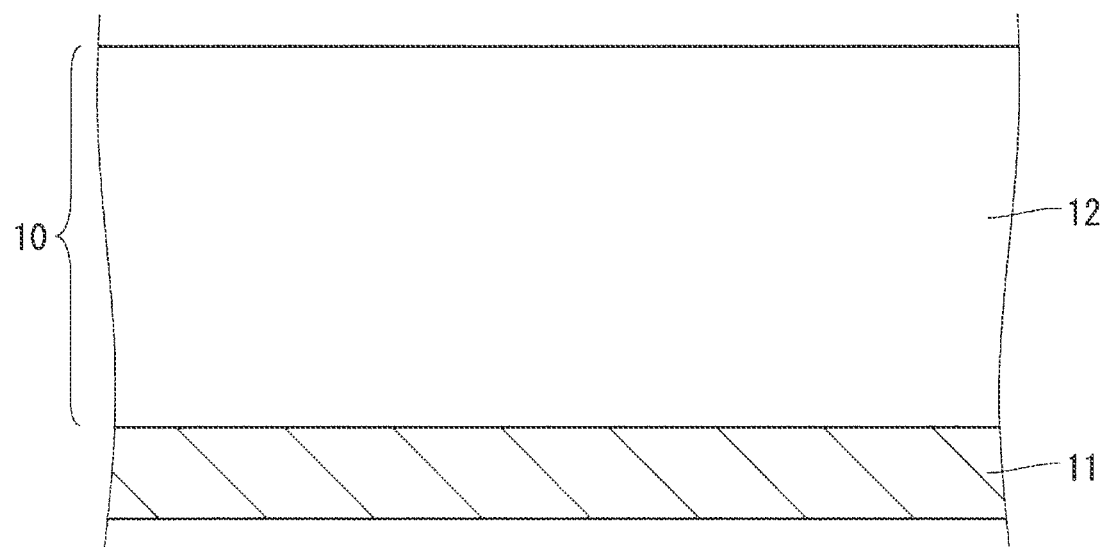
FIGS. 2 to 6 are partial sectional views each schematically showing one step of a method of manufacturing the silicon carbide semiconductor device according to the first preferred embodiment of the present invention.

Referring to FIG. 2, the SiC substrate 11 is prepared. Further, the epitaxial layer 10 is prepared on the SiC substrate 11. At this point in time, the epitaxial layer 10 can be configured using only the drift layer 12 having the n-type. More specifically, the n-type epitaxial layer 10 is formed by the epitaxial growth method implemented on the SiC substrate 11. Typically, an n-type and low-resistance substrate is used as the SiC substrate 11. However, the SiC substrate 11 is not limited to such a substrate. An impurity concentration in the epitaxial layer 10 and the thickness of the epitaxial layer 10 are selectable in a manner that depends on a breakdown voltage required for the MOSFET 101. For example, the impurity concentration is from $1\times10^{13}$ to $1\times10^{18}$ cm$^{-3}$ and the thickness is from 4 to 200 μm.

Figure 3:
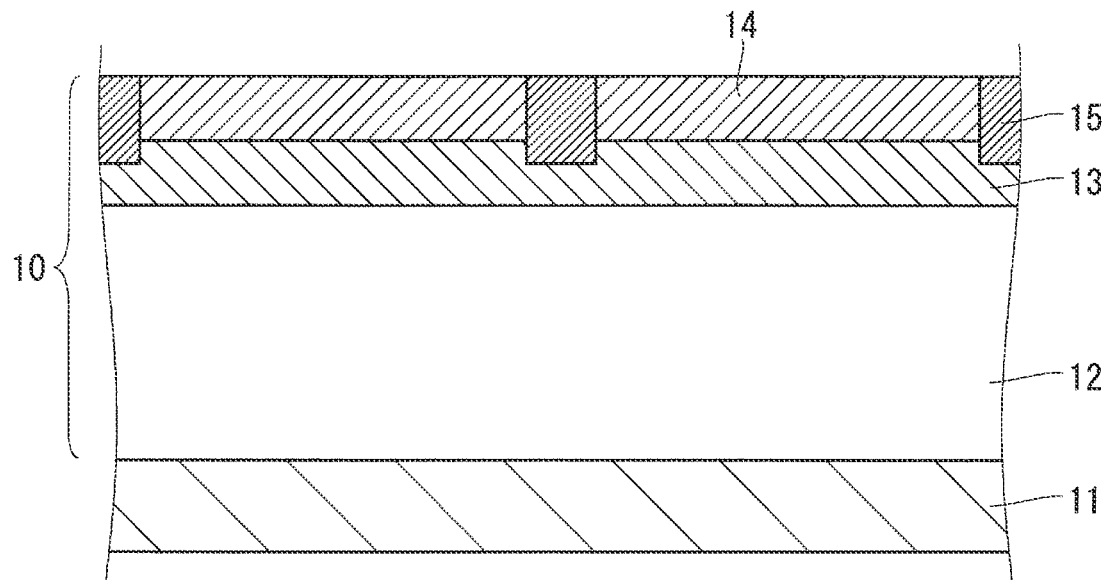

Referring to FIG. 3, the p-type well region 13, the n-type source region 14, and the p-type well contact region 15 are formed using publicly-known lithography technique and ion implantation technique, etc. Each of these region is formed by ion implantation performed by using a mask that can be a resist or an oxide film processed by photolithography, for example. Ions to be used are aluminum (Al) ions for formation of the p-type region, and nitrogen (N) ions for formation of the n-type region, for example. For formation of the well region 13, Al ions are implanted so as to achieve an impurity concentration from about $1\times10^{15}$ to about $1\times10^{18}$ cm$^{-3}$ and an implantation depth from about 0.3 to about 2.0 μm, for example. The source region 14 is formed so as to have a bottom surface not exceeding the bottom surface of the well region 13. The source region 14 has an impurity concentration exceeding the impurity concentration in the well region 13. For example, the impurity concentration in the source region 14 is from about $1\times10^{17}$ to about $1\times10^{21}$ cm$^{-3}$, for example. For formation of the well contact region 15, Al ions are implanted so as to achieve an impurity concentration from about $1\times10^{17}$ to about $1\times10^{21}$ cm$^{-3}$ and an implantation depth from about 0.3 to about 1.0 μm, for example. The well contact region 15 is formed so as to have a bottom surface reaching the well region 13. The well contact region 15 is desirably formed at a substrate temperature of 150° C. or more.

Figure 4:
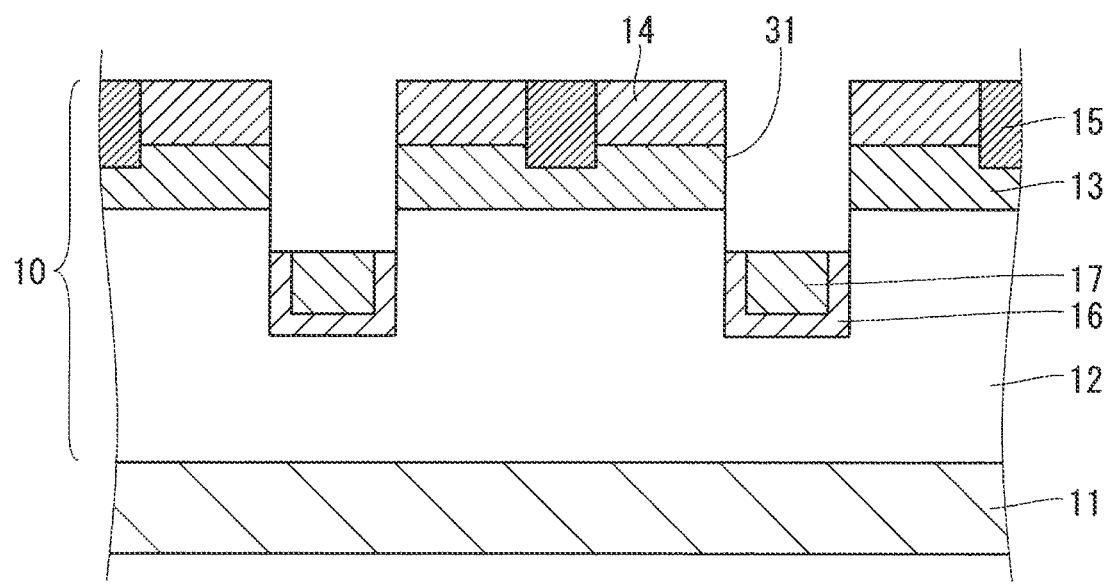

Referring to FIG. 4, the gate trench 31 is formed using lithography technique and etching technique. The p-type electric field relaxation region 16 and the n-type surge relaxation region 17 are formed at the bottom of the gate trench 31 using ion implantation technique, for example. The gate trench 31 is formed so as to pass through the source region 14 and the well region 13 to reach the drift layer 12 and so as to ensure an intended breakdown voltage. As an example, the gate trench 31 is formed to a depth from about 0.5 to about 3.0 μm by reactive ion etching (RIE). The electric field relaxation region 16 is formed so as to have an impurity concentration from about $1\times10^{15}$ to about $1\times10^{21}$ cm$^{-3}$, for example. The surge relaxation region 17 is formed so as to have an impurity concentration from about $1\times10^{15}$ to about $1\times10^{21}$ cm$^{-3}$, for example. An ion implantation mask used in the ion implantation for forming the electric field relaxation region 16 and the surge relaxation region 17 may be the same as an etching mask used for forming the gate trench 31, or may be an implantation mask prepared separately.

Next, annealing is performed in an atmosphere of inactive gas such as Ar gas using a thermal processing device (not shown in the drawings). The annealing is performed in a period from 30 seconds to one hour at a temperature from 1300 to 1900° C., for example. As a result of this annealing, the implanted n-type impurities (donor impurities) such as N and the implanted p-type impurities (acceptor impurities) such as Al are activated.

Figure 5:
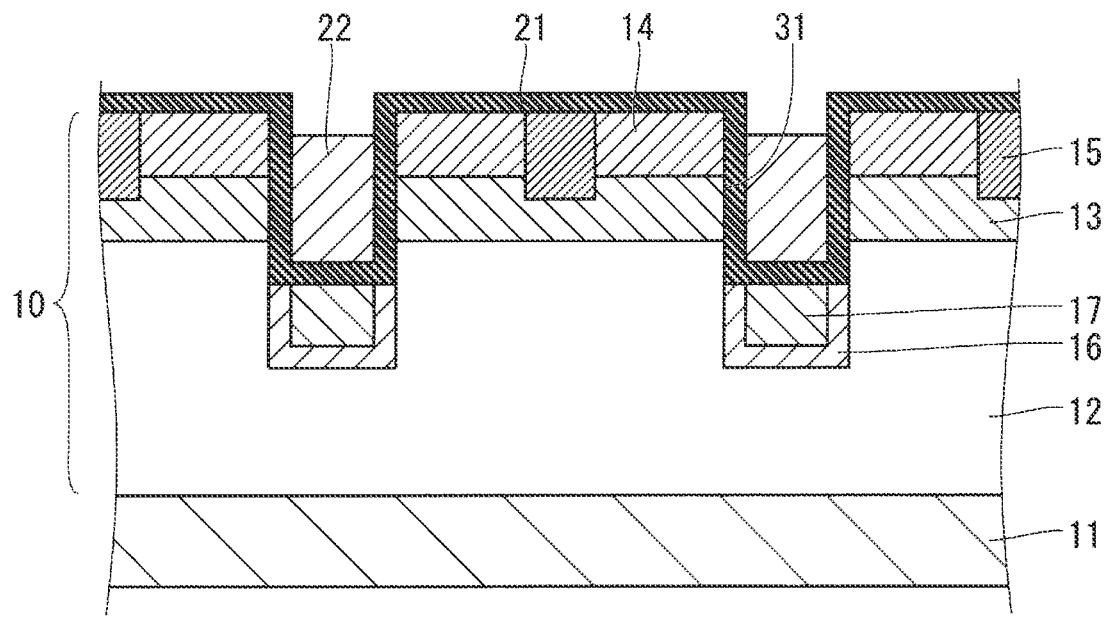

Referring to FIG. 5, the gate insulating film 21 and the gate electrode 22 are formed on the epitaxial layer 10. The gate insulating film 21 is formed by thermal oxidation process, deposition process, or a combination of the thermal oxidation process and the deposition process. After formation of the gate insulating film 21, thermal processing may be performed in an atmosphere of nitrogen, ammonia, NO, or N$_2$O. The gate electrode 22 is formed by depositing a polysilicon film through chemical vapor deposition (CVD) process, and etching the resultant polysilicon film using a resist patterned by photolithography as a mask, for example. Polysilicon may contain impurities such as phosphorous (P) or boron (B). Adding the impurities achieves a low sheet resistance.

Figure 6:
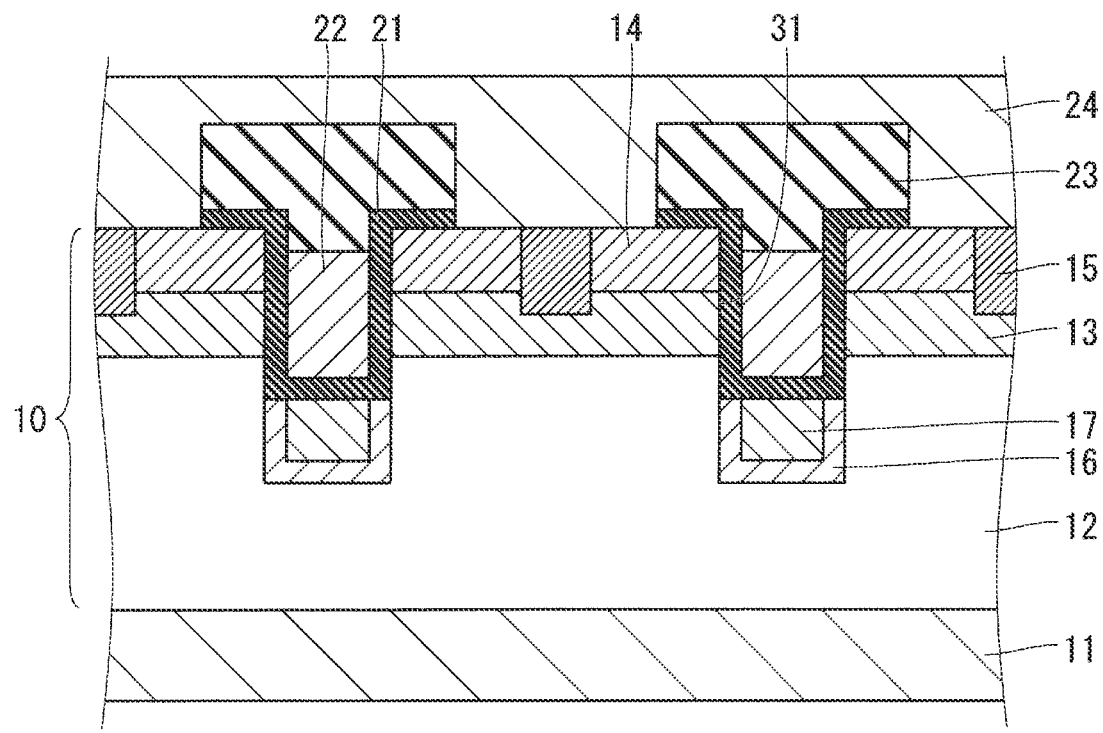

Referring to FIG. 6, the interlayer insulating film 23 is formed. The interlayer insulating film 23 is formed by preparing an insulating film by process such as CVD, and etching the resultant insulating film partially, for example. This etching is performed so as to form a contact in the interlayer insulating film 23 where each of the source region 14 and the well contact region 15 is exposed at least partially. A step performed next is for forming ohmic contact in this contact area. As an example, a metal film such as Ni or Ti is deposited first on the substrate entire surface. Then, thermal processing is performed in a temperature from 600 to 1000° C., thereby forming a silicide layer (not shown in the drawings). A part of this metal film remaining on the interlayer insulating film 23 is removed by wet etching.

The source electrode 24 is formed by depositing a conductive film and patterning the resultant conductive film. Metal used for deposition of the conductive film is Al, Cu, Ti, Ni, Mo, W, or Ta, for example. Alternatively, nitrides or alloys of these metals may be used. The conductive film may include a single layer or stacked layers. Simultaneously with formation of the source electrode 24, a gate pad may be formed to be separated from the source electrode 24 and connected to the gate electrode 22.

Referring back to FIG. 1, the drain electrode 25 is formed. A metal film such as Ti, Ni, Ag, or Au is formed as the drain electrode 25 by sputtering process or deposition process, for example. To ensure ohmic contact of the drain electrode 25, the foregoing silicide layer is preferably formed in advance on the opposite surface (in FIG. 1, lower surface) of the SiC substrate 11. As a result of the foregoing steps, formation of the MOSFET 101 is completed.

(Modification of Manufacturing Method)

Modifications of the steps of forming the gate trench 31, the electric field relaxation region 16, and the surge relaxation region 17 described above by referring to FIG. 4 will be described below by referring to FIGS. 7 to 9.

Figure 7:
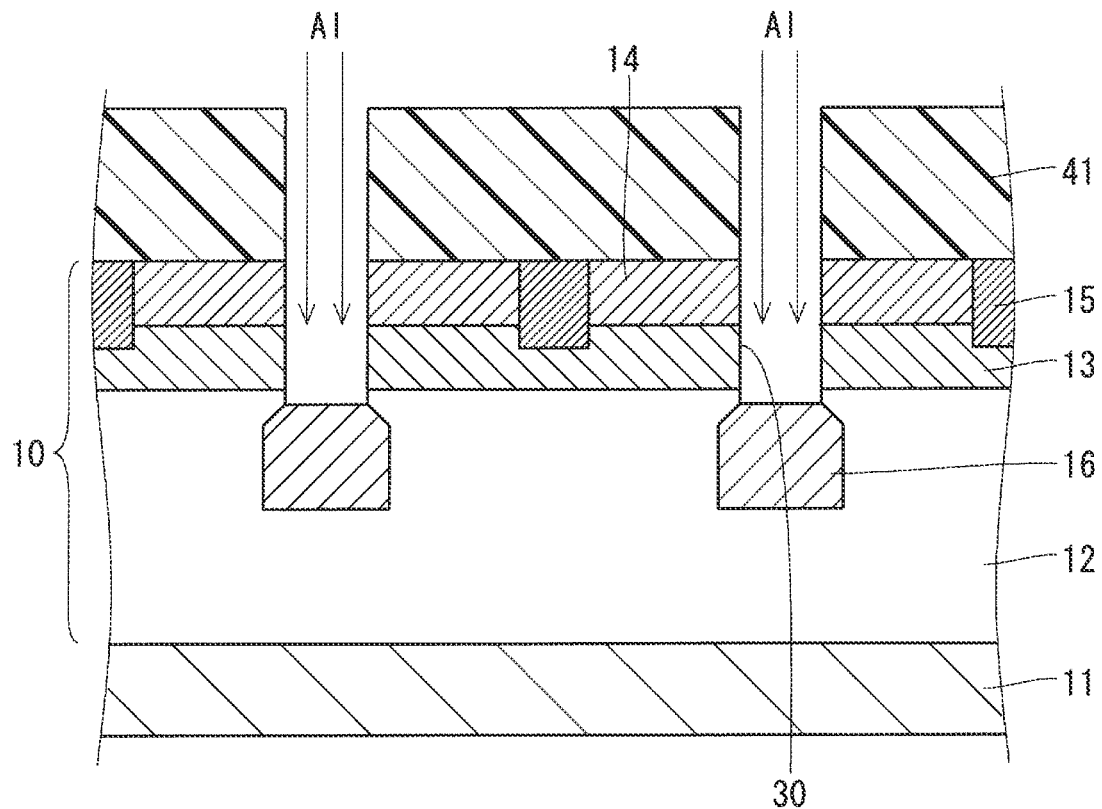
FIGS. 7 to 9 are partial sectional views each schematically showing one step of a modification of the method of manufacturing the silicon carbide semiconductor device according to the first preferred embodiment of the present invention.

Referring to FIG. 7, the drift layer 12 is etched to form a preliminary trench 30. The preliminary trench 30 is shallower than the gate trench 31 (FIG. 1). Impurities (Al, for example) of the p-type (second conductivity type different from the first conductivity type) are implanted by ion implantation into the bottom of the preliminary trench 30. By doing so, the electric field relaxation region 16 is formed. As a result of collision of the implanted ions with a semiconductor crystal, a part of the electric field relaxation region 16 at a relatively deep position has a larger width (dimension in the lateral direction in FIG. 7) than a part of the electric field relaxation region 16 at a relatively shallow position.

Figure 8:
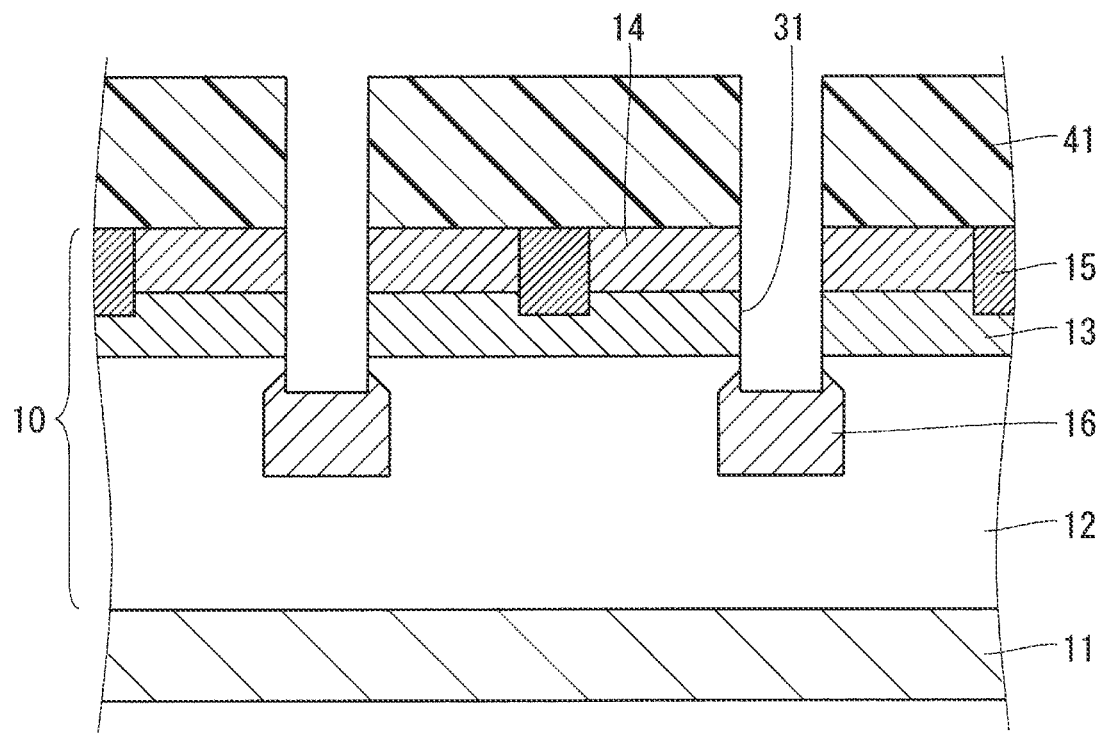

Referring to FIG. 8, the bottom of the preliminary trench 30 is etched. By doing so, the gate trench 31 having a greater depth than the preliminary trench 30 is formed. The bottom of the gate trench 31 is at a deeper position than the bottom of the preliminary trench 30 (FIG. 7). Thus, the electric field relaxation region 16 becomes thicker in the vicinity of the edge of the bottom of the gate trench 31.

Figure 9:
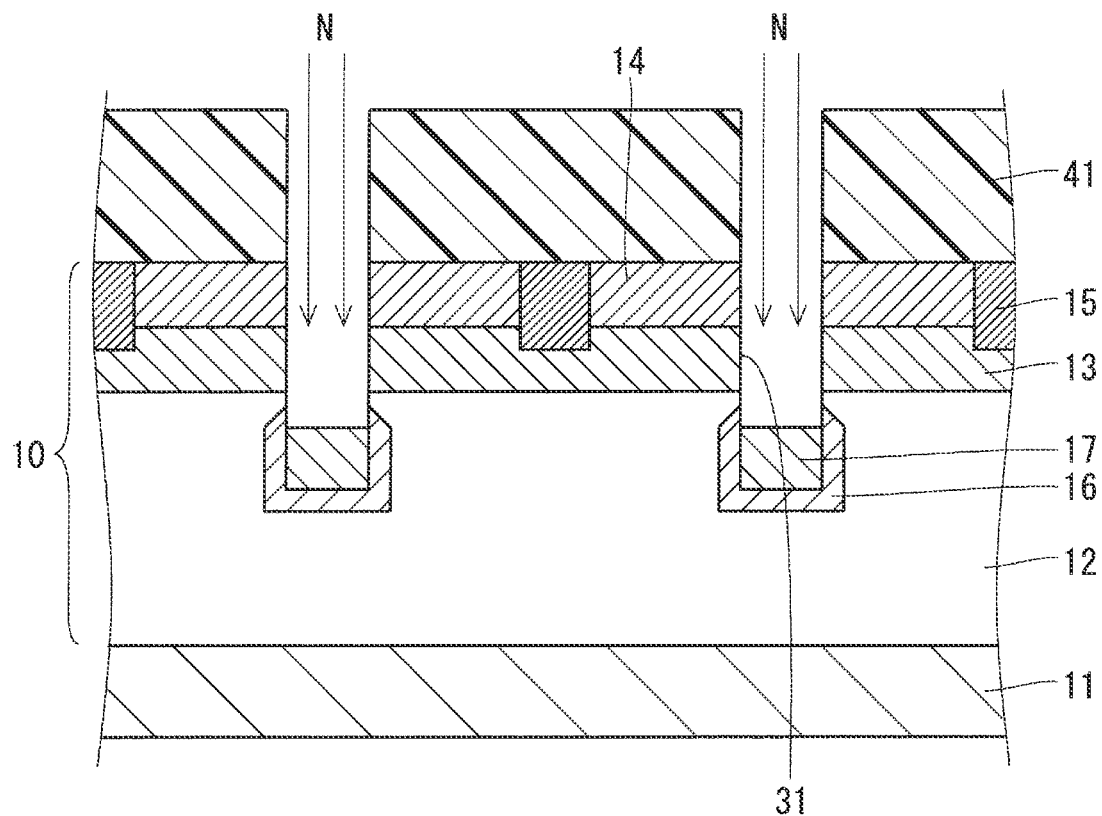

Referring to FIG. 9, n-type impurities (N ions, for example) are implanted by ion implantation into the bottom of the gate trench 31. By doing so, the surge relaxation region 17 is formed to contact at least a part of the bottom of the gate trench 31 and to be separated from the drift layer 12 by the electric field relaxation region 16. In the ion implantation for forming the surge relaxation region 17, the implanted ions reach a depth less than the depth of the ions implanted for forming the electric field relaxation region 16. As a result, scattering of the implanted ions in a width direction (lateral direction in FIG. 9) is reduced during formation of the surge relaxation region 17, compared to scattering of the implanted ions during formation of the electric field relaxation region 16. This makes it possible to reduce the width of the surge relaxation region 17, compared to the width of the electric field relaxation region 16.

(Modification of Configuration)

Figure 10:
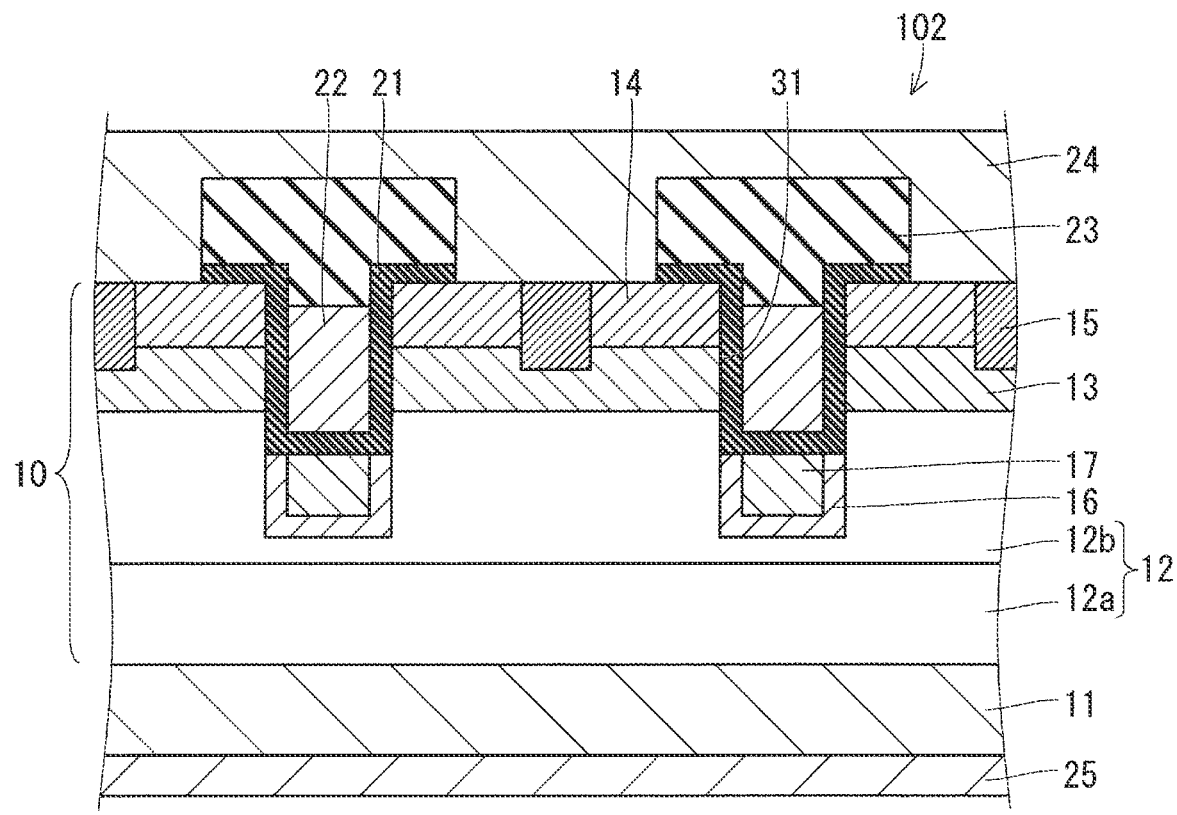
FIG. 10 is a partial sectional view showing a modification of FIG. 1.

FIG. 10 is a partial sectional view showing an MOSFET 102 as a modification of the MOSFET 101 (FIG. 1).

In the MOSFET 102, the drift layer 12 includes a low-concentration region 12a and a current expansion region 12b. The current expansion region 12b has a higher impurity concentration than the low-concentration region 12a and is arranged under the p-type well region 13. The current expansion region 12b may be formed during the ion implantation into the epitaxial layer 10.

The current expansion region 12b functions to suppress expansion of a deletion layer to occur in response to application of a voltage to the drain electrode 25 in an ON state. This allows reduction in an ON voltage in the MOSFET 102. The current expansion region 12b shown in FIG. 10 has a greater depth than the electric field relaxation region 16 and the surge relaxation region 17. However, the implantation depth (thickness) of the current expansion region 12b and the impurity concentration in the current expansion region 12b may be designed appropriately so as to achieve an intended breakdown voltage and intended reliability.

(Overview of Effect)

The MOSFET 101 of the first preferred embodiment (FIG. 1) includes the surge relaxation region 17 contacting at least a part of the bottom of the gate trench 31. This prevents a high electric field resulting from steep voltage variations in the electric field relaxation region 16 from being applied at least to the foregoing part of the gate trench 31. As a result, the occurrence of insulation breakdown is reduced in the gate insulating film 21.

In the first preferred embodiment, the electric field relaxation region 16 has the second conductivity type which is the p-type. In this case, a hole current is caused to flow from the electric field relaxation region 16 toward the source electrode 24 on the occurrence of a surge. In the case of SiC semiconductor, the resistance of the p-type region is considerably higher than the resistance of the n-type region, so that a large potential difference is caused by the hole current in the electric field relaxation region 16 as a p-type region. At this time, a part of the gate insulating film 21 contacting the electric field relaxation region 16 may be subjected to application of a high electric field. In the first preferred embodiment, a part of the gate insulating film 21 contacting the n-type surge relaxation region 17 is free from the application of this high electric field. As a result, the occurrence of insulation breakdown is reduced in the gate insulating film 21.

In the method of manufacturing the MOSFET 101, particularly in the method employing the steps shown in FIGS. 7 to 9, etching is performed further after the electric field relaxation region 16 is formed by implanting impurities into the preliminary trench 30. Then, the surge relaxation region 17 is formed by impurity implantation. In this case, the MOSFET 101 of the first preferred embodiment is obtained through the simple steps.

Second Preferred Embodiment

Figure 11:
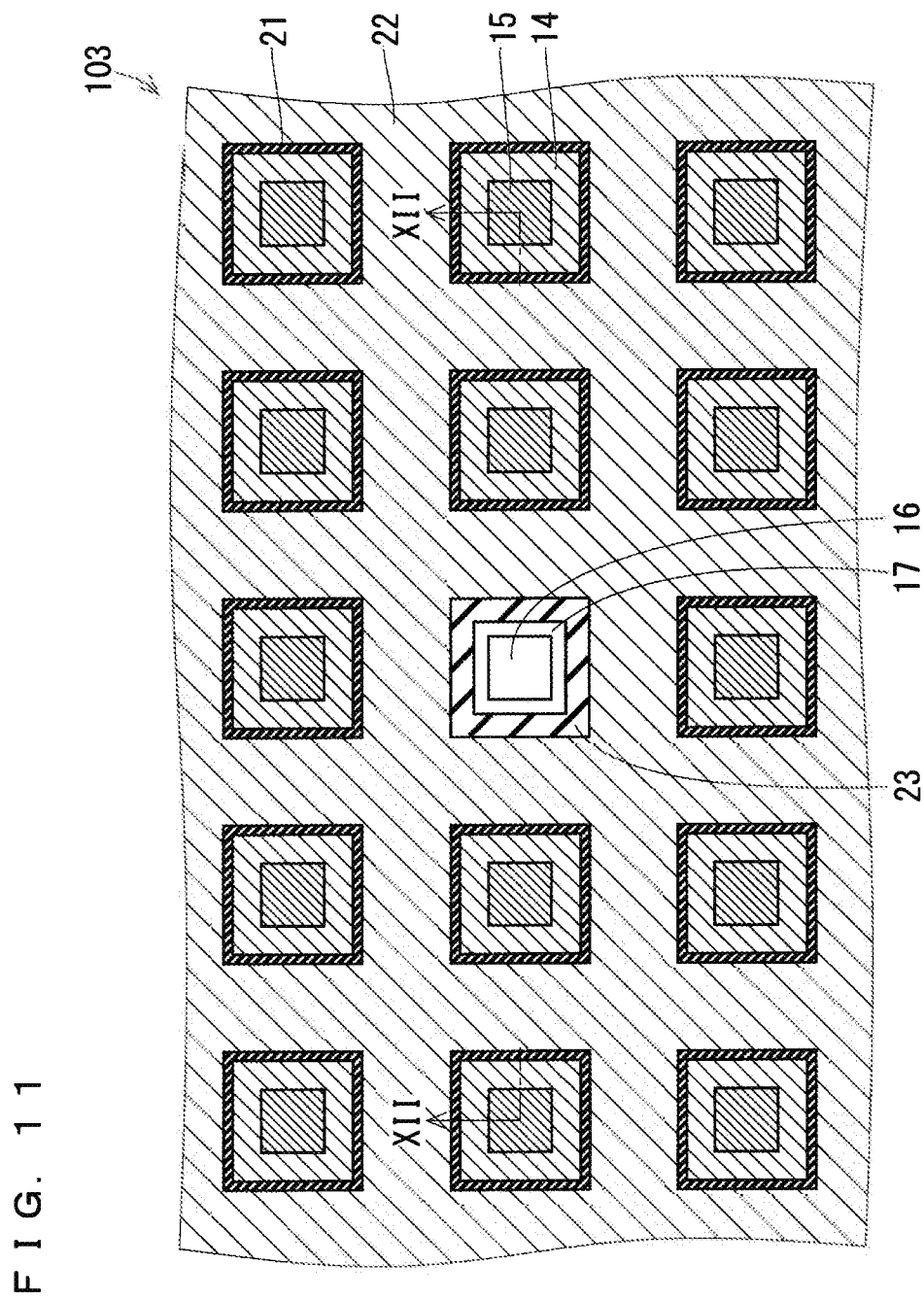
FIG. 11 schematically shows the configuration of a silicon carbide semiconductor device according to a second preferred embodiment of the present invention and is a partial sectional view taken along a line XI-XI in FIG. 12.
Figure 12:
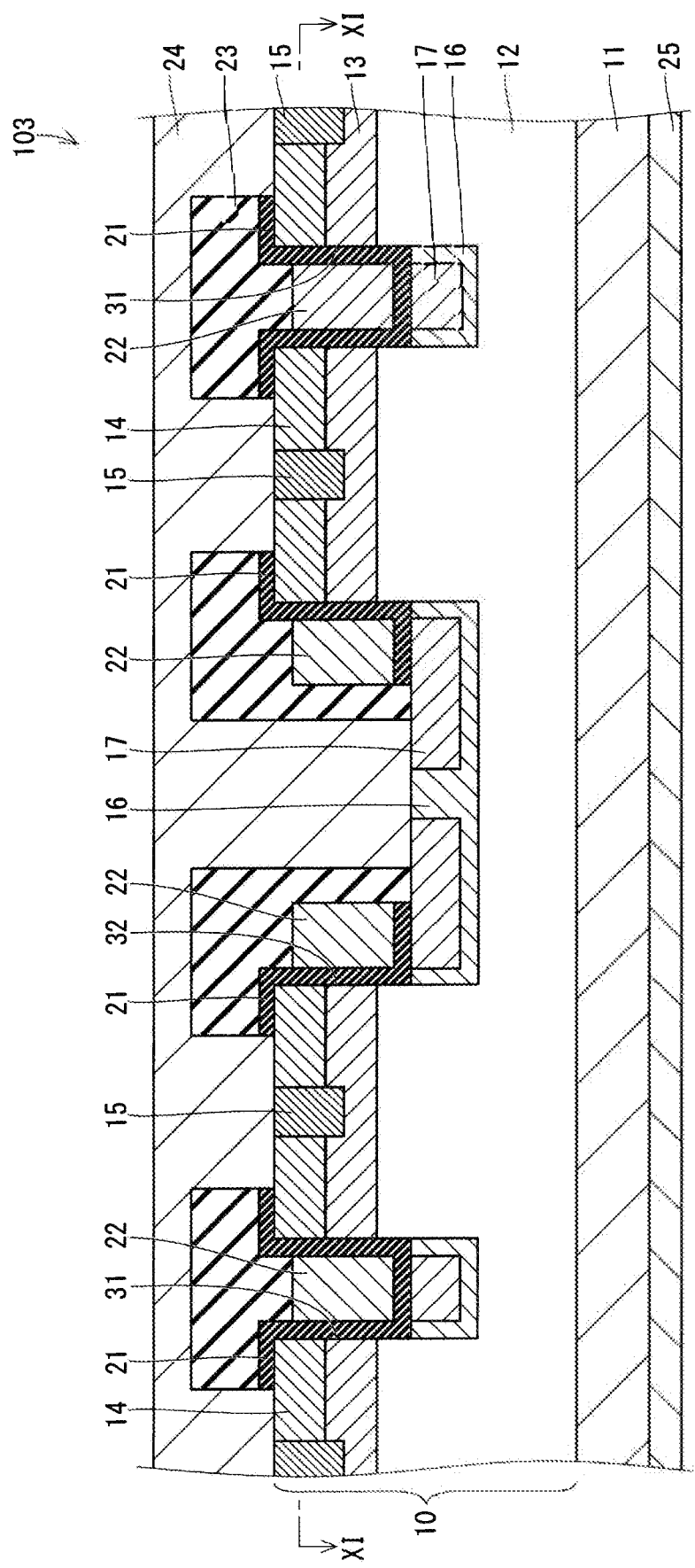
FIG. 12 schematically shows the configuration of the silicon carbide semiconductor device according to the second preferred embodiment of the present invention and is a partial sectional view taken along a line XII-XII in FIG. 11.

FIG. 11 schematically shows the configuration of an MOSFET 103 (silicon carbide semiconductor device) according to a second preferred embodiment and is a partial sectional view taken along a line XI-XI in FIG. 12. FIG. 12 is a partial sectional view taken along a line XII-XII in FIG. 11. The illustration of the source electrode 24 is omitted from FIG. 11.

Referring to FIG. 11, in the second preferred embodiment, multiple cell structures of the MOSFET 103 are aligned in an in-plane direction. In FIG. 11, the gate electrode 22 has a lattice pattern in a planar layout. However, this is not the only planar layout of the gate electrode 22 but the gate electrode 22 may also have a stripe pattern, for example.

Referring to FIG. 12, the right region and the left region in FIG. 12 have configurations similar to the configuration in FIG. 1 (first preferred embodiment). Meanwhile, in the central part of FIG. 12, a source trench 32 is provided in the epitaxial layer 10.

The source trench 32 reaches the surge relaxation region 17. The source electrode 24 passes through the source trench 32 to contact the surge relaxation region 17. By doing so, the source electrode 24 and the surge relaxation region 17 are electrically connected to each other. The source trench 32 reaches the electric field relaxation region 16. The source electrode 24 passes through the source trench 32 to contact the electric field relaxation region 16. By doing so, the source electrode 24 and the electric field relaxation region 16 are electrically connected to each other.

In the second preferred embodiment, the foregoing electrical contact structure is provided at the central part of the source trench 32, and the external lateral part of the source trench 32 is provided with the similar structure to the gate trench 31. Thus, the source trench 32 can also contribute to formation of a channel.

Structures except the foregoing structures are substantially the same as those of the first preferred embodiment described above. Thus, a corresponding or comparable part is given the same reference sign and will not be described repeatedly. Like that of the first preferred embodiment, the drift layer 12 of the second preferred embodiment may include the low-concentration region 12a and a current expansion region 12b (FIG. 10).

(Effect)

In the second preferred embodiment, the source electrode 24 passes through the source trench 32 to contact the surge relaxation region 17. Thus, on the occurrence of a surge, a path of a displacement current formed in the surge relaxation region 17 is connected efficiently to the source electrode 24. This makes it possible to reduce an electric field further applied to the gate insulating film 21. As a result, the occurrence of breakdown is reduced further in the gate insulating film 21.

The source electrode 24 passes through the source trench 32 to contact the electric field relaxation region 16. Thus, on the occurrence of a surge, a path of a displacement current formed in the electric field relaxation region 16 is connected efficiently to the source electrode 24. This makes it possible to further reduce an electric field applied to the gate insulating film 21. As a result, the occurrence of insulation breakdown is reduced further in the gate insulating film 21.

Third Preferred Embodiment (Configuration)

Figure 13:
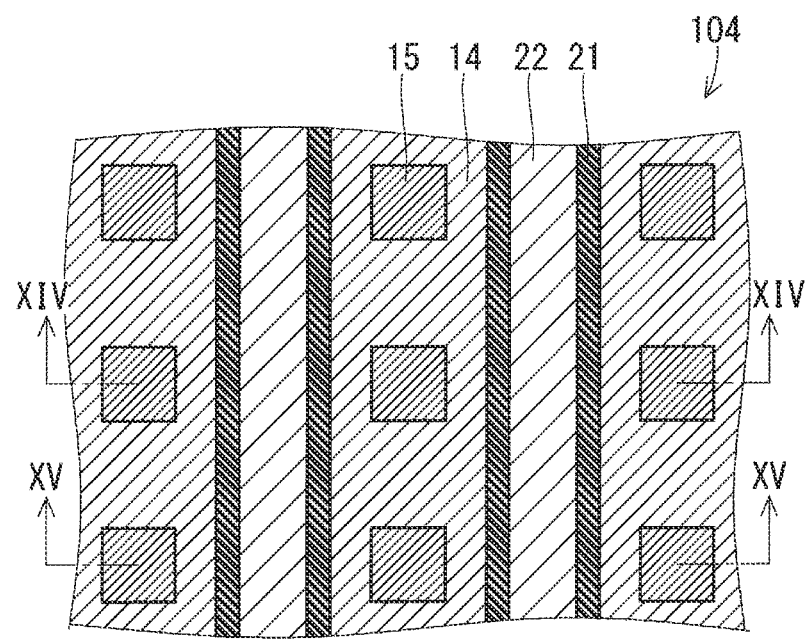
FIG. 13 schematically shows the configuration of a silicon carbide semiconductor device according to a third preferred embodiment of the present invention and is a partial sectional view taken along a line XIII-XIII in each of FIGS. 14 and 15.

FIG. 13 schematically shows the configuration of an MOSFET 104 (silicon carbide semiconductor device) according to a third preferred embodiment and is a partial sectional view taken along a line XIII-XIII in each of FIGS.

Figure 14:
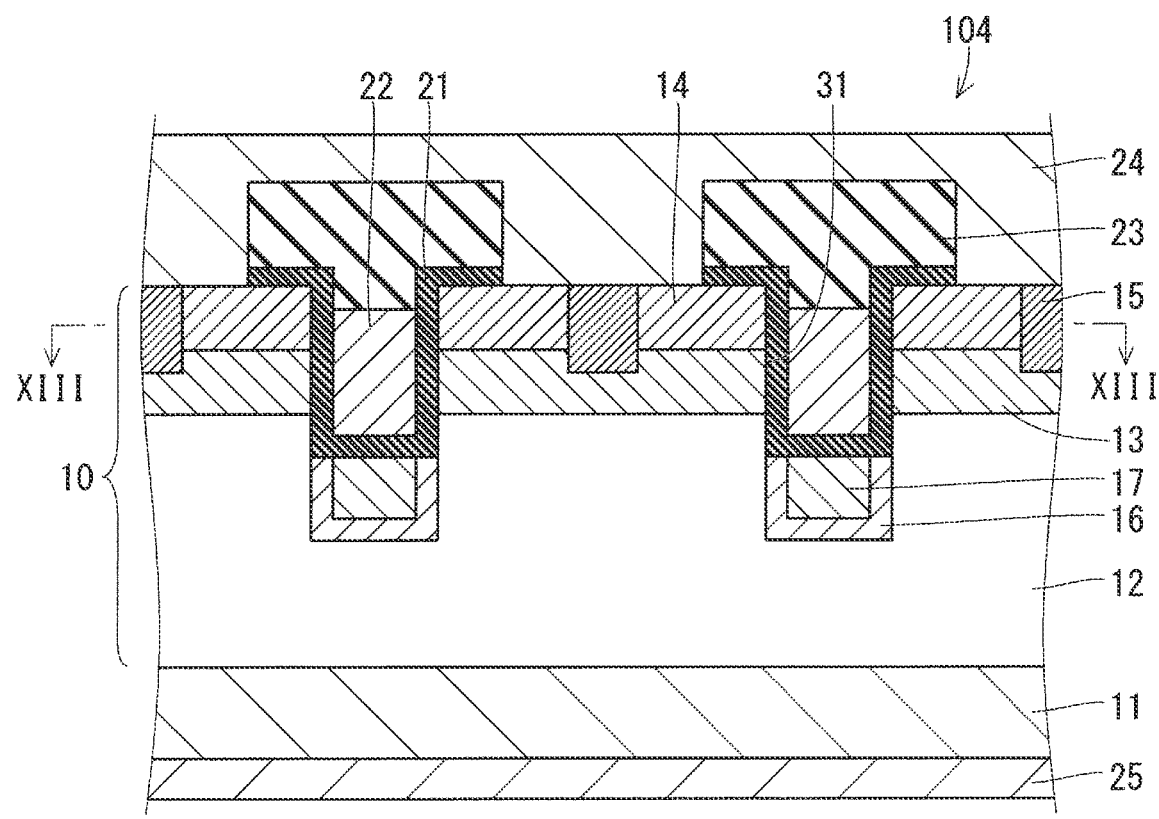
FIG. 14 schematically shows the configuration of the silicon carbide semiconductor device according to the third preferred embodiment of the present invention and is a partial sectional view taken along a line XIV-XIV in FIG. 13.
Figure 15:
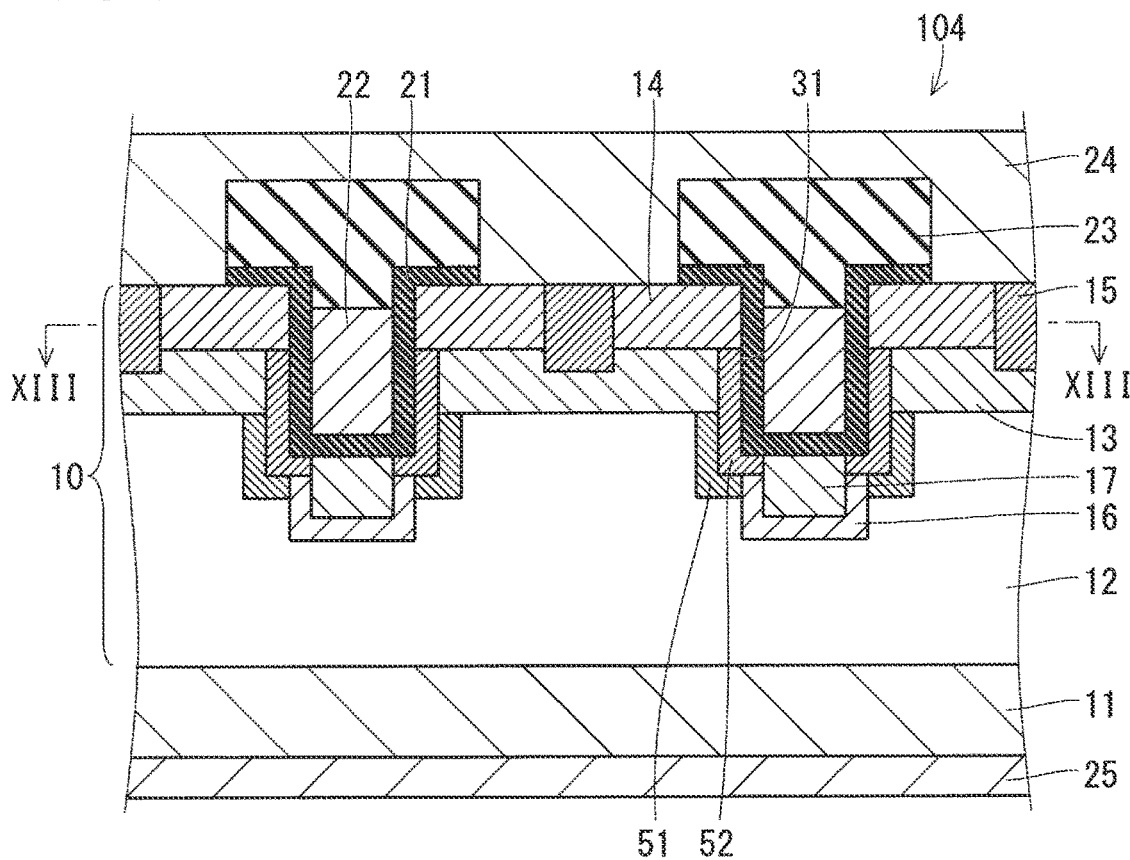
FIG. 15 schematically shows the configuration of the silicon carbide semiconductor device according to the third preferred embodiment of the present invention and is a partial sectional view taken along a line XV-XV in FIG. 13.

14 and 15. FIGS. 14 and 15 are partial sectional views taken along a line XIV-XIV and a line XV-XV respectively in FIG. 13.

Referring to FIG. 13, in the third preferred embodiment, multiple cell structures of the MOSFET 104 are aligned in an in-plane direction. In FIG. 13, the planar layout of the gate electrode 22, in other words, the planar layout of the gate trench 31 is a stripe pattern.

Referring to FIG. 14, the MOSFET 104 includes a part where a cross-sectional configuration is similar to the cross-sectional configuration of the MOSFET 101 (FIG. 1). At least this part has the function of forming a channel in the MOSFET 104.

Referring to FIG. 15, the MOSFET 104 includes a part where a cross-sectional configuration differs from the cross-sectional configuration of the MOSFET 101 (FIG. 1). More specifically, in the MOSFET 104, the epitaxial layer 10 includes a side-wall source region 52 (first connection region) having the n-type. The side-wall source region 52 extends along the inner surface of the gate trench 31 and connects the surge relaxation region 17 to the source region 14. By doing so, the surge relaxation region 17 and the source region 14 become connected to each other through only the semiconductor region having the n-type. In the MOSFET 104, the epitaxial layer 10 further includes a side-wall well region 51 (second connection region) having the p-type. The side-wall well region 51 connects the electric field relaxation region 16 to the well region 13. By doing so, the electric field relaxation region 16 and the well region 13 become connected to each other through only the semiconductor region having the p-type. The side-wall source region 52 is separated from the drift layer 12 by the side-wall well region 51. In a planar layout, the ratio of an area including the side-wall well region 51 and the side-wall source region 52, in other words, a ratio between the configuration of FIG. 14 and the configuration of FIG. 15 may be designed so as to achieve an intended short tolerance and an intended ON resistance.

(Effect)

In the third preferred embodiment, on the occurrence of a surge, a path of a displacement current formed in the surge relaxation region 17 is connected efficiently to the source region 14 by the side-wall source region 52. This makes it possible to reduce an electric field further applied to the gate insulating film 21. As a result, the occurrence of insulation breakdown is reduced further in the gate insulating film 21.

On the occurrence of a surge, a path of a displacement current formed in the electric field relaxation region 16 is connected efficiently to the well region 13 by the side-wall well region 51. This makes it possible to further reduce an electric field applied to the gate insulating film 21. As a result, the occurrence of insulation breakdown is reduced further in the gate insulating film 21.

(Manufacturing Method)

A method of manufacturing the MOSFET 104 will be described next by referring to FIGS. 16 to 19. Steps performed before steps described below are similar to the steps shown in FIGS. 2 and 3 (first preferred embodiment), so that these preliminary steps will not be described.

Figure 16:
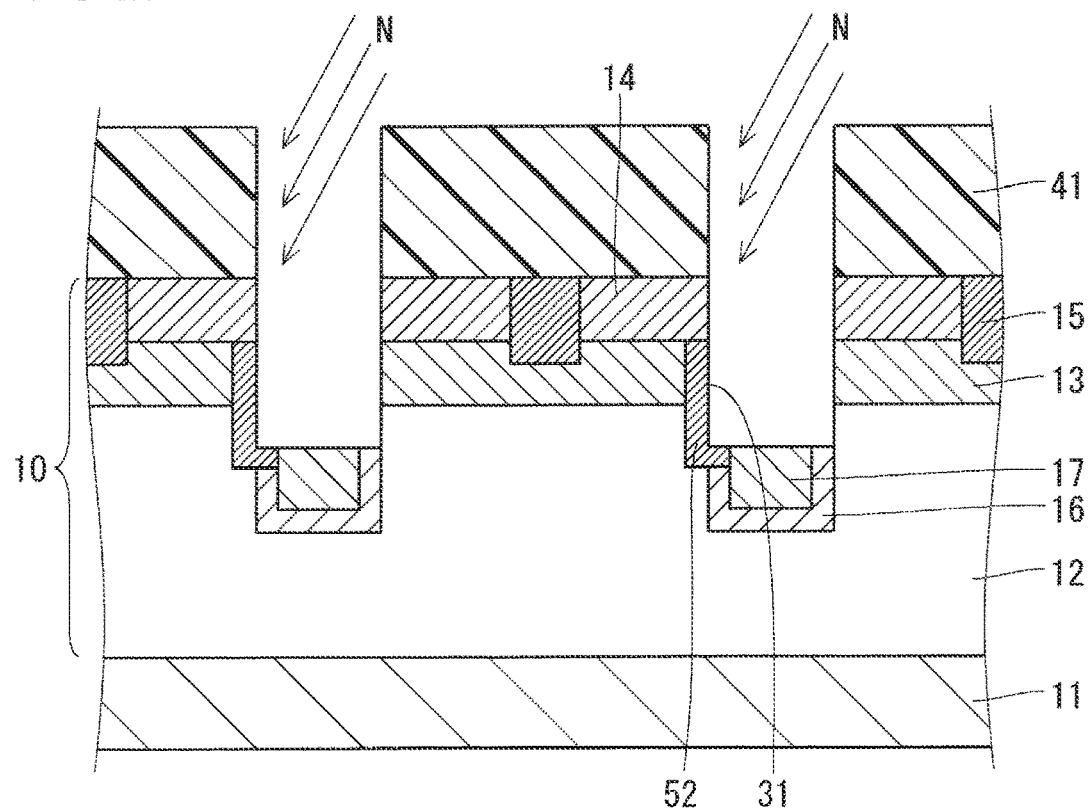
FIGS. 16 to 19 are partial sectional views each schematically showing one step of a method of manufacturing the silicon carbide semiconductor device according to the third preferred embodiment of the present invention.

Referring to FIG. 16, the epitaxial layer 10 is etched to form the gate trench 31. This etching is performed using an etching mask 41. Next, n-type impurities (N ions, for example) are added by oblique ion implantation into the lateral part of the gate trench 31 to form the side-wall source region 52. As shown in FIG. 16, the oblique ion implantation is a method of implanting ions in an implantation direction tilted from the surface of the substrate 11. In FIG. 16, the implantation direction is selected so as to implant the ions into one side surface (left side surface) of the gate trench 31. By doing so, the side-wall source region 52 is formed to extend along the left side surface of the gate trench 31.

Figure 17:
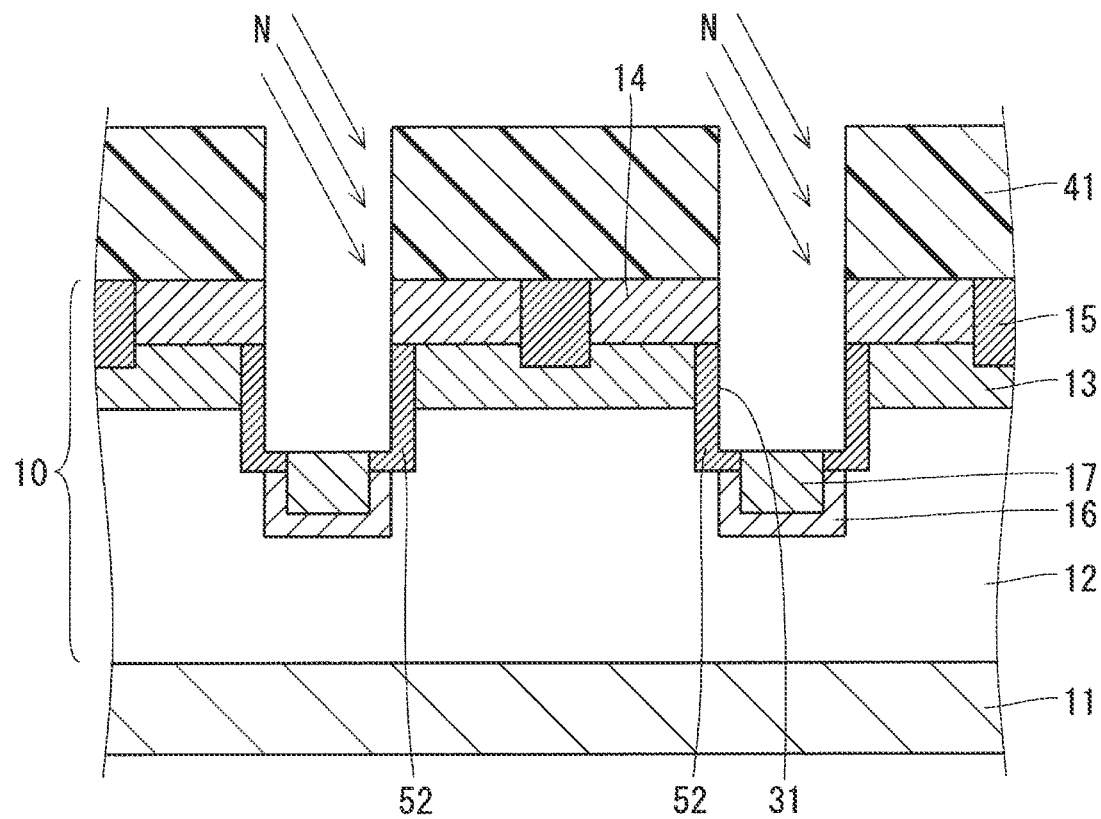

Referring to FIG. 17, ions are thereafter implanted while an in-plane component of the implantation direction is reversed from that shown in FIG. 16. By doing so, the side-wall source region 52 is formed to extend along the opposite side surface (right side surface) of the gate trench 31 in FIG. 17.

Figure 18:
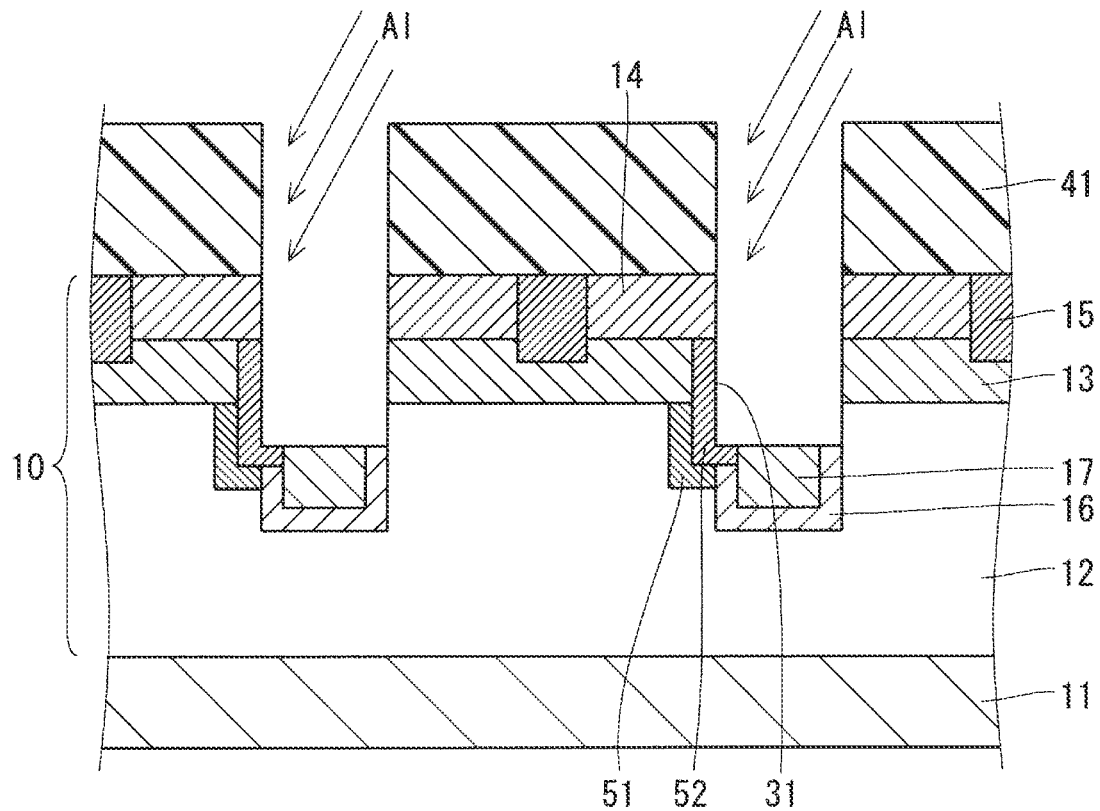

Referring to FIG. 18, p-type impurities (Al ions, for example) are added next by oblique ion implantation into the lateral part of the gate trench 31 to form the side-wall well region 51. In FIG. 18, an implantation direction is selected so as to implant the ions into one side surface (left side surface) of the gate trench 31. By doing so, the side-wall well region 51 is formed in the vicinity of the left side surface of the gate trench 31 in the presence of the side-wall source region 52 between this side surface and the side-wall well region 51.

Figure 19:
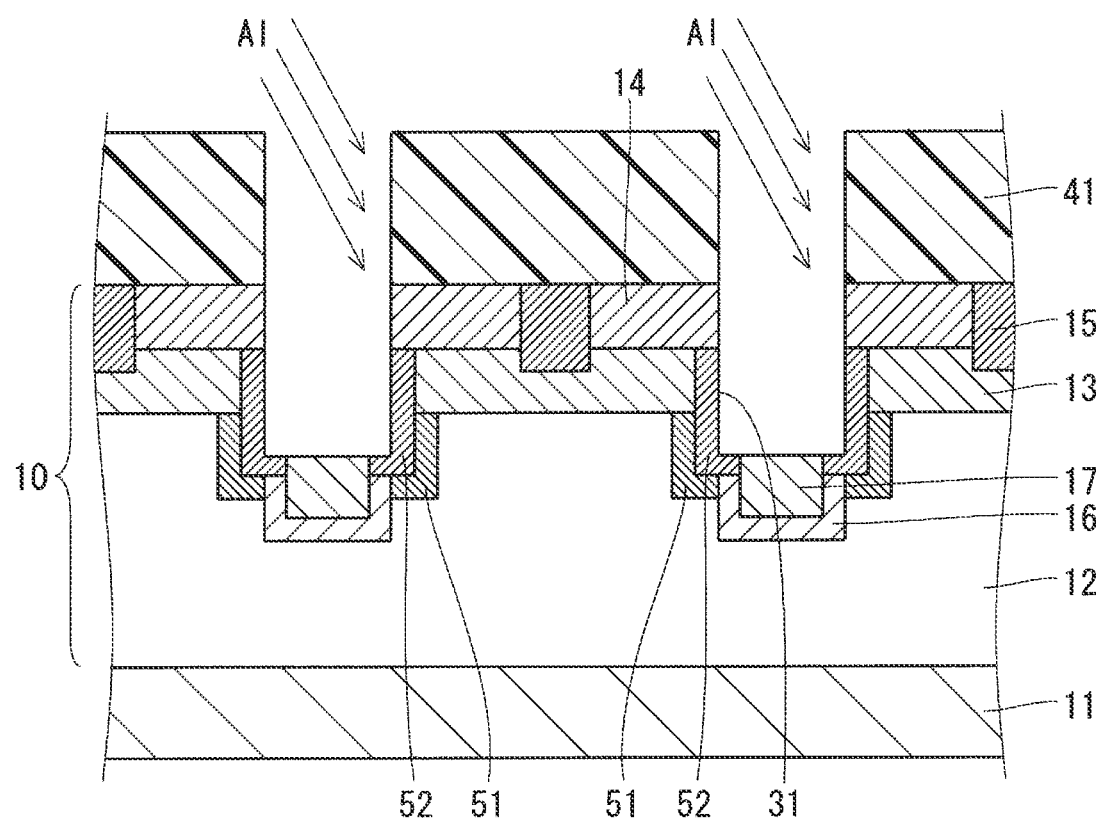

Referring to FIG. 19, ions are thereafter implanted while an in-plane component of the implantation direction is reversed from that shown in FIG. 18. By doing so, the side-wall well region 51 is formed in the vicinity of the opposite side surface (right side surface) of the gate trench 31 in FIG. 19 in the presence of the side-wall source region 52 between this side surface and the side-wall well region 51.

The foregoing order of ion implantation may be determined arbitrarily. Thus, the side-wall source region 52 may be formed after formation of the side-wall well region 51. In each ion implantation step, the foregoing etching mask 41 may be used as an implantation mask for the ion implantation. Subsequent steps are substantially the same as the steps described in the first preferred embodiment by referring to FIG. 5 and its subsequent drawings, so that these subsequent steps will not be described.

(Modification of Manufacturing Method)

Figure 20:
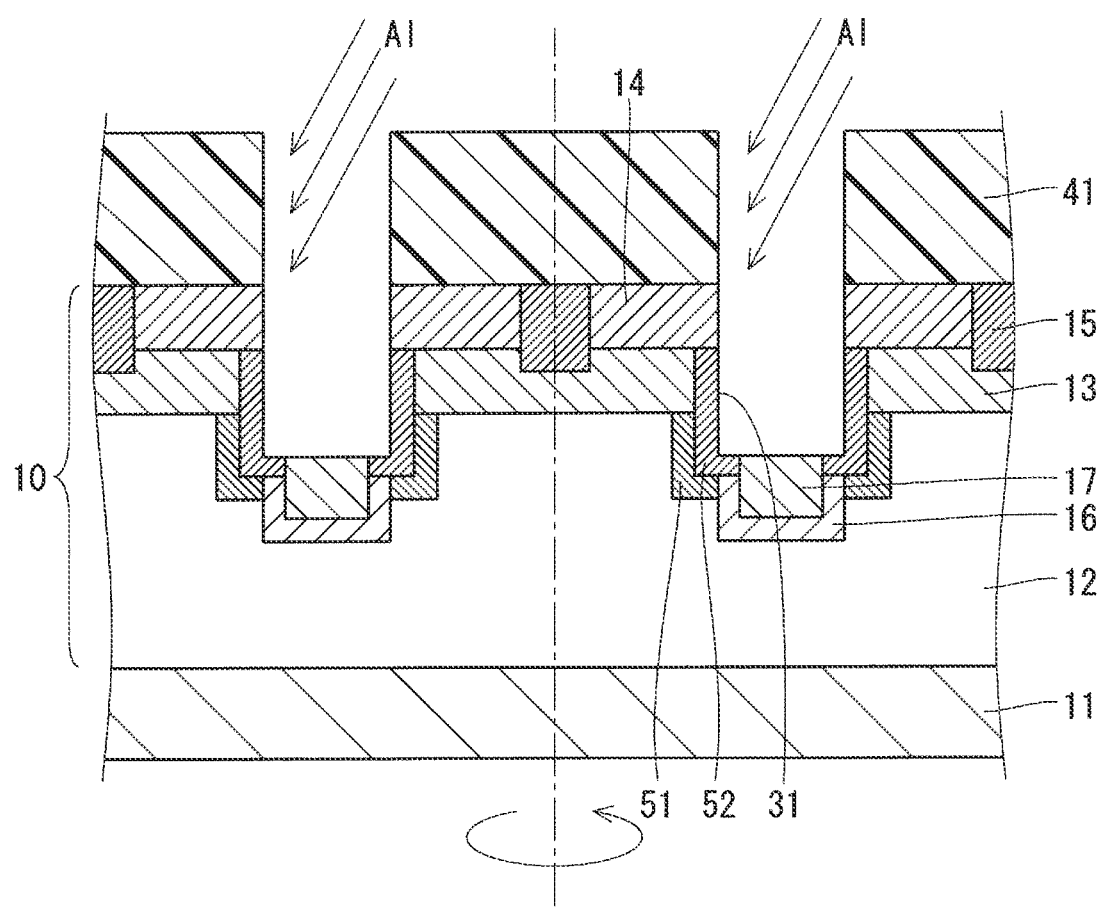
FIG. 20 is a partial sectional view schematically showing one step of a modification of the method of manufacturing the silicon carbide semiconductor device according to the third preferred embodiment of the present invention.

FIG. 20 is a partial sectional view schematically showing a modification of the steps shown in FIGS. 18 and 19. In a step shown in FIG. 20, the p-type impurities are added by rotating ion implantation into the lateral part of the gate trench 31 to form the side-wall well region 51. As shown in FIG. 20, the rotating ion implantation is oblique ion implantation accompanied by the rotation of the SiC substrate 11. Instead of rotating the SiC substrate 11, an in-plane component of an implantation direction may be rotated.

In this modification, the side-wall well region 51 can be formed by adding the p-type impurities by the rotating ion implantation into the lateral part of the gate trench 31. Thus, the resultant side-wall well region 51 is formed around the gate trench 31 entirely (in all directions). This makes it possible to separate the side-wall source region 52 more reliably from the drift layer 12 by the side-wall well region 51.

(Modification of Configuration)

Figure 21:
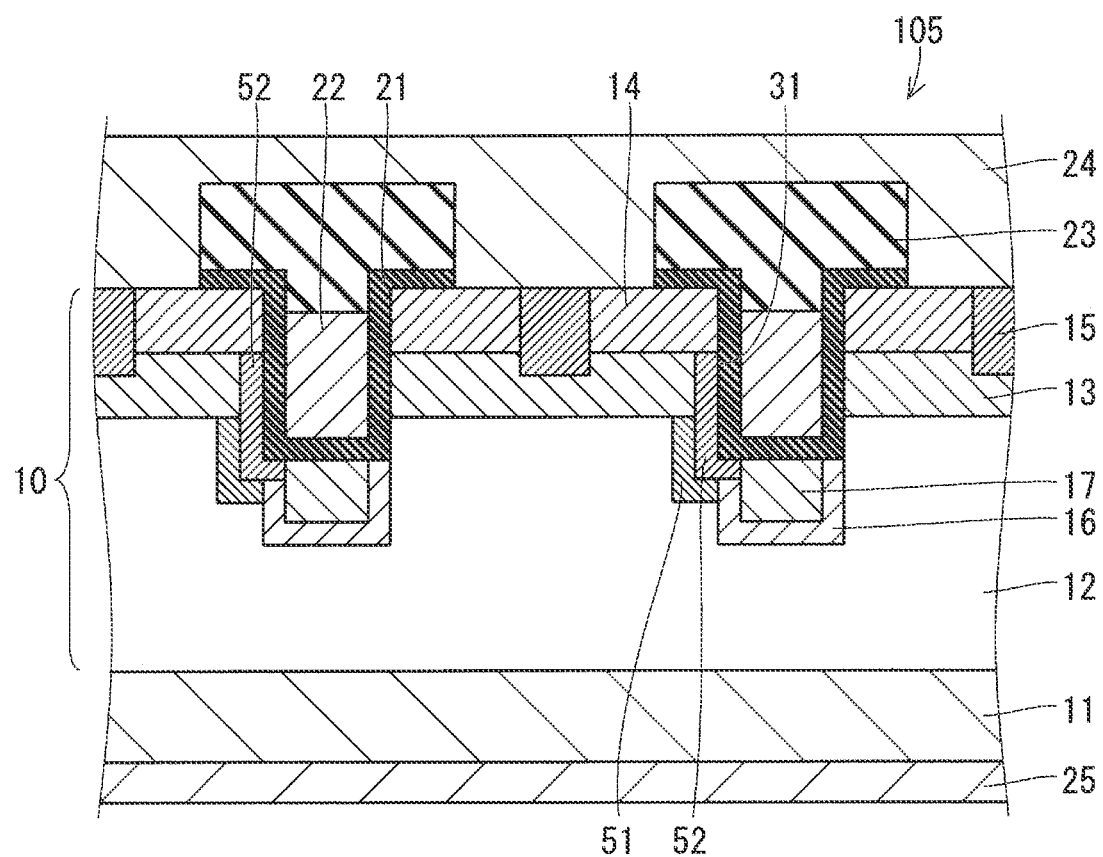
FIG. 21 is a partial sectional view showing a modification of FIG. 15.

FIG. 21 is a partial sectional view showing an MOSFET 105 as a modification of the MOSFET 104 (FIG. 15). In the MOSFET 105, the side-wall well region 51 and the side-wall source region 52 are provided only on one side surface (in FIG. 21, left side surface) of the gate trench 31, and are not provided on the opposite side surface (in FIG. 21, right side surface) of the gate trench 31. In this modification, a channel in the MOSFET 105 can be formed on the opposite side surface of the gate trench 31. This allows reduction in the ON resistance of the MOSFET 105. A planar layout of an area including the side-wall well region 51 and the side-wall source region 52 may be designed so as to achieve an intended short tolerance and an intended ON resistance.

Fourth Preferred Embodiment

Figure 22:
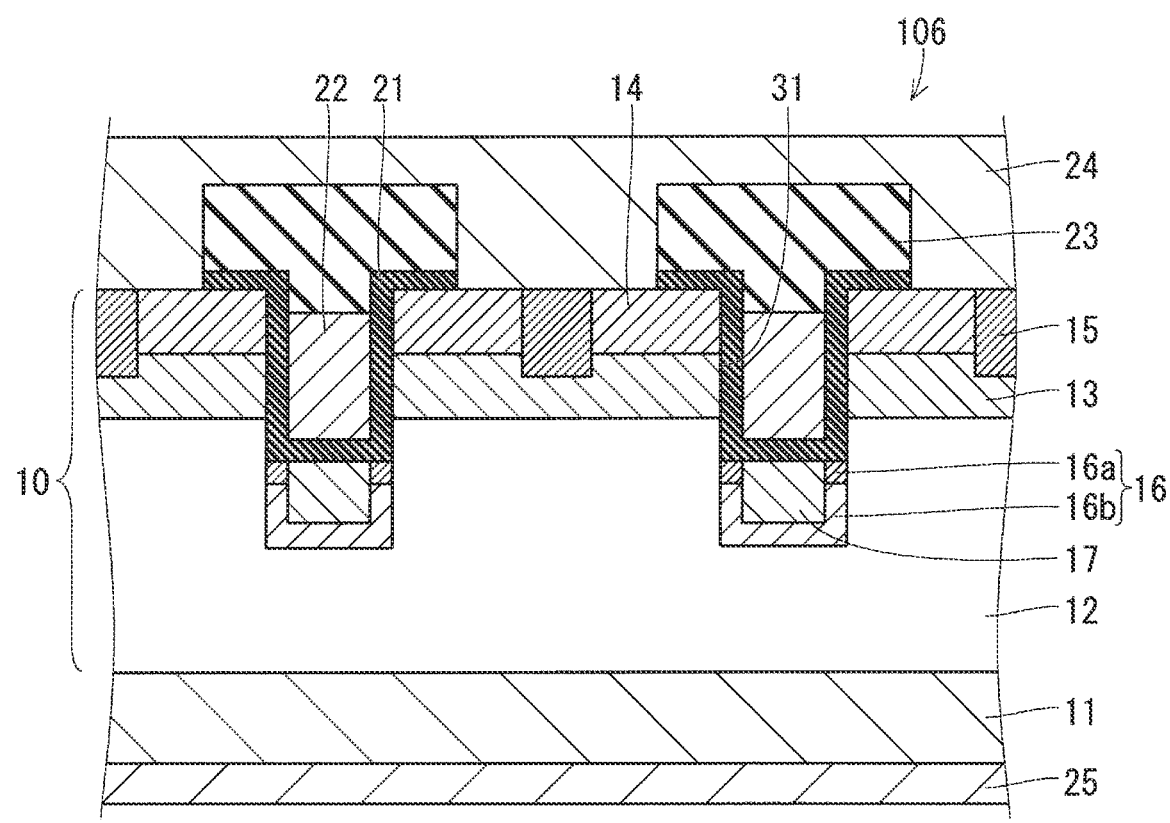
FIG. 22 is a partial sectional view schematically showing the configuration of a silicon carbide semiconductor device according to a fourth preferred embodiment of the present invention.

FIG. 22 is a partial sectional view schematically showing the configuration of an MOSFET 106 (silicon carbide semiconductor device) according to a fourth preferred embodiment. In the MOSFET 106, the electric field relaxation region 16 includes a contact part 16a contacting the gate trench 31 and a separated part 16b separated from the gate trench 31 by the contact part 16a. The contact part 16a has a lower impurity concentration than the separated part 16b. For example, the impurity concentration in the contact part 16a is from $1 \times 10^{15}$ to $1 \times 10^{20}$ cm$^{-3}$, and the impurity concentration in the separated part 16b is from $1 \times 10^{16}$ to $1 \times 10^{21}$ cm$^{-3}$. An impurity concentration may be changed discontinuously between the contact part 16a and the separated part 16b. Alternatively, an impurity concentration may be changed continuously (gradually) between the contact part 16a and the separated part 16b.

In the fourth preferred embodiment, the electric field relaxation region 16 includes the contact part 16a contacting the gate trench 31 and the separated part 16b separated from the gate trench 31 by the contact part 16a. This causes a displacement current in the electric field relaxation region 16 to flow preferentially in the separated part 16b having the relatively high impurity concentration. This reduces the magnitude of the displacement current flowing in the contact part 16a contacting the gate trench 31. Thus, the magnitude of an electric field applied to the gate insulating film is reduced. As a result, the occurrence of insulation breakdown is reduced in the gate insulating film 21.

Fifth Preferred Embodiment

In a fifth preferred embodiment, any of the silicon carbide semiconductor devices according to the first to fourth preferred embodiments or the modifications thereof (MOSFETs 101 to 106) described above is applied to a power converter. While the present invention is not limited to a particular power converter, application of the present invention to a three-phase inverter will be described below as the fifth preferred embodiment.

Figure 23:
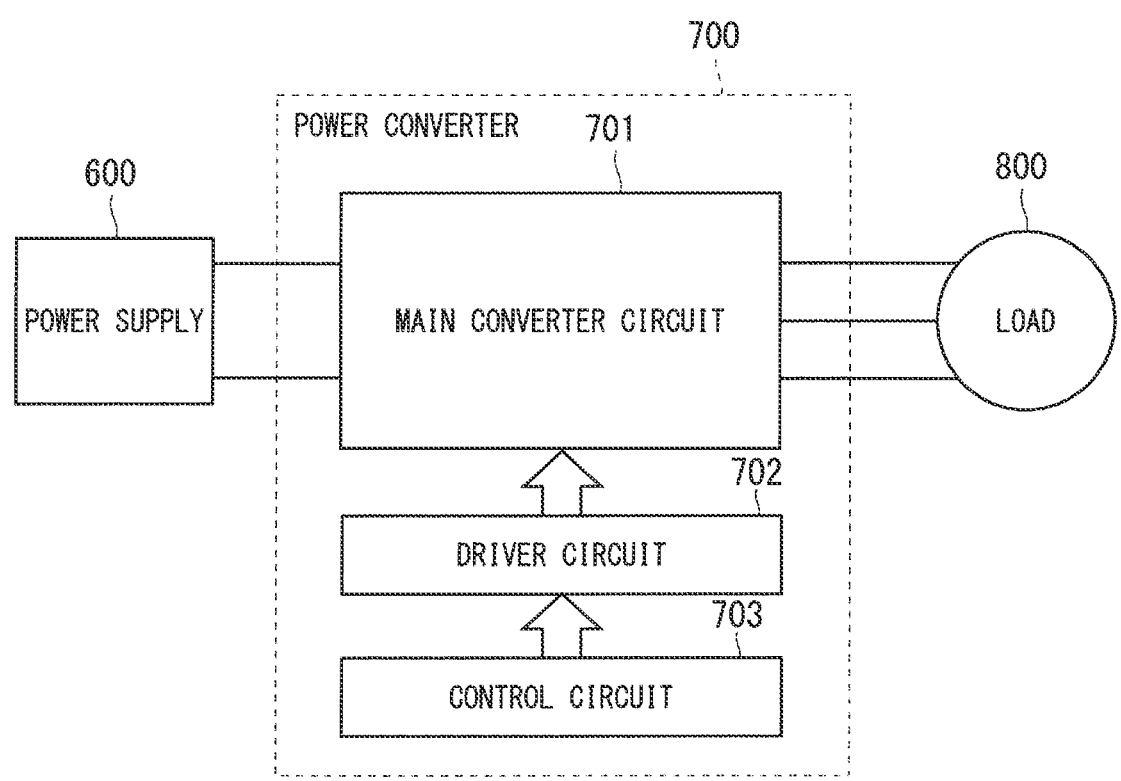
FIG. 23 is a block diagram schematically showing the configuration of a power conversion system to which a power converter according to a fifth preferred embodiment of the present invention is applied.

FIG. 23 is a block diagram schematically showing the configuration of a power conversion system to which a power converter 700 according to the fifth preferred embodiment of the present invention is applied. The power converter 700 is a three-phase inverter connected between a power supply 600 and a load 800. The power converter 700 converts DC power supplied from the power supply 600 to AC power, and supplies the AC power to the load 800. The power converter 700 includes a main converter circuit 701, a driver circuit 702, and a control circuit 703. The main converter circuit 701 includes at least one of the silicon carbide semiconductor devices according to the first to fourth preferred embodiments or the modifications thereof as a switching element. The main converter circuit 701 converts the input DC power to the AC power, and outputs the resultant AC power. The driver circuit 702 outputs a driving signal for driving each silicon carbide semiconductor device as the switching element to this silicon carbide semiconductor device. The control circuit 703 outputs a control signal for controlling the driver circuit 702 to the driver circuit 702.

The power supply 600 is a DC power supply and supplies DC power to the power converter 700. The power supply 600 can be configured using various types of power supplies. For example, the power supply 600 can be configured using a DC system, a solar cell, or a battery. Alternatively, the power supply 600 can be configured using a rectifier circuit connected to an AC system or an AC/DC converter, for example. Still alternatively, the power supply 600 can be configured using a DC/DC converter for converting DC power output from a DC system to predetermined power.

The load 800 is a three-phase motor to be driven by AC power supplied from the power converter 700. The load 800 is not limited to particular purpose but is a motor to be installed on various types of electric devices. For example, the load 800 is used as a motor for hybrid cars, electric cars, railroad vehicles, elevators, or air conditioners.

The power converter 700 will be described in detail below. The main converter circuit 701 includes a switching element and a freewheeling diode (not shown in FIG. 23). In response to switching of the switching element, the main converter circuit 701 converts DC power supplied from the power supply 600 to AC power, and supplies the resultant AC power to the load 800. While various specific circuit configurations are applicable to the main converter circuit 701, the main converter circuit 701 of the fifth preferred embodiment is a two-level three-phase full bridge circuit and can be configured using six switching elements, and six freewheeling diodes connected inverse-parallel to corresponding ones of the switching elements. Every two of the six switching elements are connected in series to form an upper arm and a lower arm, and the upper and lower arms form each phase (each of a U phase, a V phase, and a W phase) of the full bridge circuit. An output terminal of the upper and lower arms, namely, three output terminals of the main converter circuit 701 are connected to the load 800.

The driver circuit 702 generates a driving signal for driving the switching element in the main converter circuit 701, and supplies the generated driving signal to a control electrode of the switching element in the main converter circuit 701. More specifically, in response to a control signal from the control circuit 703 described later, the driver circuit 702 outputs a driving signal for bringing the switching element to an ON state and a driving signal for bringing the switching element to an OFF state to the control electrode of each switching element. To maintain the switching element in an ON state, the driving signal is a voltage signal (on signal) at a voltage level equal to or more than a threshold voltage of the switching element. To maintain the switching element in an OFF state, the driving signal is a voltage signal (off signal) at a voltage level equal to or less than the threshold voltage of the switching element.

The control circuit 703 controls the switching element in the main converter circuit 701 so as to supply intended power to the load 800. More specifically, the control circuit 703 calculates a period (on period) in which each switching element in the main converter circuit 701 is to be in an ON state based on power to be supplied to the load 800. For example, the control circuit 703 may control the main converter circuit 701 under pulse width modulation (PWM) control for modulating the on period of the switching element in response to a voltage to be output. The control circuit 703 outputs a control command (control signal) to the driver circuit 702 so as to output an on signal to a switching element to be brought to an ON state and output an off signal to a switching element to be brought to an OFF state at a corresponding moment. In response to this control signal, the driver circuit 702 outputs an on signal or an off signal as a driving signal to the control electrode of each switching element.

In the fifth preferred embodiment, any of the silicon carbide semiconductor devices according to the first to fourth preferred embodiments or the modifications thereof described above is used in the main converter circuit 701 in the power converter 700. This reduces the occurrence of insulation breakdown in the gate insulating film provided in the silicon carbide semiconductor device. As a result, the main converter circuit 701 provided in the power converter 700 is given enhanced reliability.

In the example described in the fifth preferred embodiment, the present invention is applied to the two-level three-phase inverter. However, the present invention is not limited to this inverter but is applicable to various types of power converters. While the power converter described in the fifth preferred embodiment is a two-level power converter, it may also be a multilevel power converter such as a three-level power converter. If power is to be supplied to a single-phase load, the present invention is applicable to a single-phase inverter. If power is to be supplied to a DC load, for example, the present invention is applicable to a DC/DC converter or an AC/DC converter.

The power converter to which the present invention is applied is not limited to the foregoing case where a load is a motor. For example, the power converter to which the present invention is applied is usable as a power supply device for any one of a discharge machine, a laser machine, an induction heating cooker, and a non-contact power feed system. The power converter to which the present invention is applied is further usable as a power conditioner in a solar power generation system or an electricity storage system, for example.

The silicon carbide semiconductor device described in detail in each of the foregoing preferred embodiments is an MOSFET. However, the silicon carbide semiconductor device may be a metal insulator semiconductor field effect transistor (MISFET) other than the MOSFET. The silicon carbide semiconductor device may also be a transistor other than the MISFET and may be an insulated gate bipolar transistor (IGBT), for example. An IGBT may be obtained by reversing the conductivity type of the silicon carbide substrate, for example.

The present invention is feasible by combining all the preferred embodiments freely, or if appropriate, by modifying or omitting each preferred embodiment within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A silicon carbide semiconductor device comprising:
    a silicon carbide substrate;
    a semiconductor layer provided on the silicon carbide substrate, the semiconductor layer including,
        a drift layer having a first conductivity type and being provided on the silicon carbide substrate,
        a well region having a second conductivity type different from the first conductivity type and being provided on the drift layer,
        a source region having the first conductivity type and being provided on the well region,
        a gate trench having an inner surface with a bottom located at a deeper position than the well region and a lateral part continuous with the bottom,
        an electric field relaxation region having the second conductivity type and having at least a part located below the bottom of the gate trench, and
        a surge relaxation region having the first conductivity type, contacting at least a part of the bottom of the gate trench, and being separated from the drift layer by the electric field relaxation region; and
    a source electrode connected to the source region, wherein
    the semiconductor layer includes a source trench reaching the surge relaxation region, and the source electrode passes through the source trench to contact the surge relaxation region, and wherein
    the source trench reaches the electric field relaxation region, and the source electrode passes through the source trench to contact the electric field relaxation region.

2. The silicon carbide semiconductor device according to claim 1, wherein
    the first conductivity type is an n-type and the second conductivity type is a p-type.

3. The silicon carbide semiconductor device according to claim 1, wherein
    the electric field relaxation region includes a contact part contacting the gate trench and a separated part separated from the gate trench by the contact part, and the contact part has a lower impurity concentration than the separated part.

4. A power converter comprising:
    a main converter circuit including the silicon carbide semiconductor device according to claim 1, and converting input power to converted power and outputting the converted power;
    a driver circuit that outputs a driving signal for driving the silicon carbide semiconductor device to the silicon carbide semiconductor device; and
    a control circuit that outputs a control signal for controlling the driver circuit to the driver circuit.

5. The silicon carbide semiconductor device according to claim 1, wherein
    the semiconductor layer includes a first connection region having the first conductivity type, extending along the inner surface of the gate trench, and connecting the surge relaxation region to the source region.

6. The silicon carbide semiconductor device according to claim 5, wherein
    the semiconductor layer includes a second connection region having the second conductivity type and connecting the electric field relaxation region to the well region, and
    the first connection region is separated from the drift layer by the second connection region.

* * * * *